US012633876B2

(12) United States Patent
Schneider et al.

(10) Patent No.: US 12,633,876 B2
(45) Date of Patent: May 19, 2026

(54) PHOTONIC IMAGE REJECTION RF MIXER, A PHASED-ARRAY RADIO FREQUENCY RECEIVER IMPLEMENTING THE SAME AND RELATED METHODS OF OPERATION

(71) Applicant: Phase Sensitive Innovations, Inc., Newark, DE (US)

(72) Inventors: Garrett Schneider, New Castle, DE (US); Janusz Murakowski, Bear, DE (US)

(73) Assignee: Phase Sensitive Innovations, Inc., Newark, DE (US)

( * ) Notice: Subject to any disclaimer, the term of this patent is extended or adjusted under 35 U.S.C. 154(b) by 0 days.

(21) Appl. No.: 17/703,916

(22) Filed: Mar. 24, 2022

(65) Prior Publication Data
US 2024/0235479 A1 Jul. 11, 2024

Related U.S. Application Data
(60) Provisional application No. 63/165,276, filed on Mar. 24, 2021.

(51) Int. Cl.
| | |
|---|---|
| *H03D 7/18* | (2006.01) |
| *H03D 7/16* | (2006.01) |
| *H04B 10/548* | (2013.01) |

(52) U.S. Cl.
CPC ............... *H03D 7/18* (2013.01); *H03D 7/165* (2013.01); *H04B 10/548* (2013.01)

(58) Field of Classification Search
CPC .............. H04B 2210/006; H04B 10/64; H04B 10/5165; H04B 10/11; H04B 1/16; H04B 10/25759; H04B 10/615; H04B 10/00; H04B 10/614; H04B 10/675;
(Continued)

(56) References Cited

U.S. PATENT DOCUMENTS

| | | | |
|---|---|---|---|
| 9,525,489 | B2 | 12/2016 | Schuetz et al. |
| 10,009,098 | B2 | 6/2018 | Murakowski et al. |
| 10,218,438 | B2 | 2/2019 | Murakowski et al. |

(Continued)

OTHER PUBLICATIONS

Schneider, Garrett J., et al. "Radiofrequency signal-generation system with over seven octaves of continuous tuning." Nature Photonics 7.2 (2013): 118-122.

(Continued)

*Primary Examiner* — Golam Sorowar
(74) *Attorney, Agent, or Firm* — Muir Patent Law, PLLC

(57) ABSTRACT

A photonic image rejection radio frequency (RF) mixer and a receiver implementing the same may suppress undesired mirror image signals having frequencies at a spectral location that is mirror-symmetric, with respect to a local oscillator (LO), to that of a signal of interest. An upconverted optical beam corresponding to a captured RF beam is extracted by an optical processor. The upconverted optical beam is mixed with the LO to obtain a desired composite optical signal and an undesired composite optical signal, each providing a corresponding beat frequency optical signal at the same frequency. The desired and undesired composite optical signals are captured by multiple optical pickups with relative phase shifts in their beat frequency optical signals which are converted into corresponding electrical signals and combined to suppress the undesired signal.

20 Claims, 14 Drawing Sheets

(58) Field of Classification Search
CPC ............ H04B 10/2507; H04B 10/2537; H01Q
3/2676; H01Q 3/24; H01Q 3/26; H01Q
3/2611
See application file for complete search history.

(56) References Cited

U.S. PATENT DOCUMENTS

| | | | |
|---|---|---|---|
| 10,313,012 B2 | 6/2019 | Murakowski et al. | |
| 10,965,100 B2 | 3/2021 | Prather | |
| 11,205,843 B2 | 12/2021 | Schneider et al. | |
| 11,662,444 B1* | 5/2023 | Going | G01S 7/497 |
| | | | 356/5.01 |
| 2019/0296831 A1* | 9/2019 | Dillon | H04B 10/64 |
| 2019/0305849 A1* | 10/2019 | Murakowski | H04B 10/00 |
| 2019/0372219 A1 | 12/2019 | Schneider et al. | |
| 2020/0252134 A1* | 8/2020 | Flint | H04B 10/2507 |
| 2020/0328573 A1 | 10/2020 | Prather | |
| 2021/0257729 A1 | 8/2021 | Murakowski et al. | |
| 2021/0297161 A1* | 9/2021 | Uyeno | G01S 13/426 |
| 2022/0146312 A1* | 5/2022 | Schilt | G01J 3/453 |

OTHER PUBLICATIONS

Zhang et al., "Large bandwidth photonic microwave image rejection mixer with high conversion efficiency," IEEE Photonics Journal 9.3 (2017): 1-8.
Zhu et al., "Photonics-based microwave image-reject mixer," Photonics 2018, 5, 6 (www.mdpi.com/journal/photonics); doi:10.3390/photonics5020006.

* cited by examiner

Channels 20
(including fibers 40)

Linear array of
fibers 40 coupled to waveguides
of chip 100 (which terminate at
channel edge 34)

Linear inputs of sensor
array 700 at beamspace
edge 36

Waveguides 60'

2D antenna array 110

Planar
optical circuit including
interference space 30 formed
in chip 100

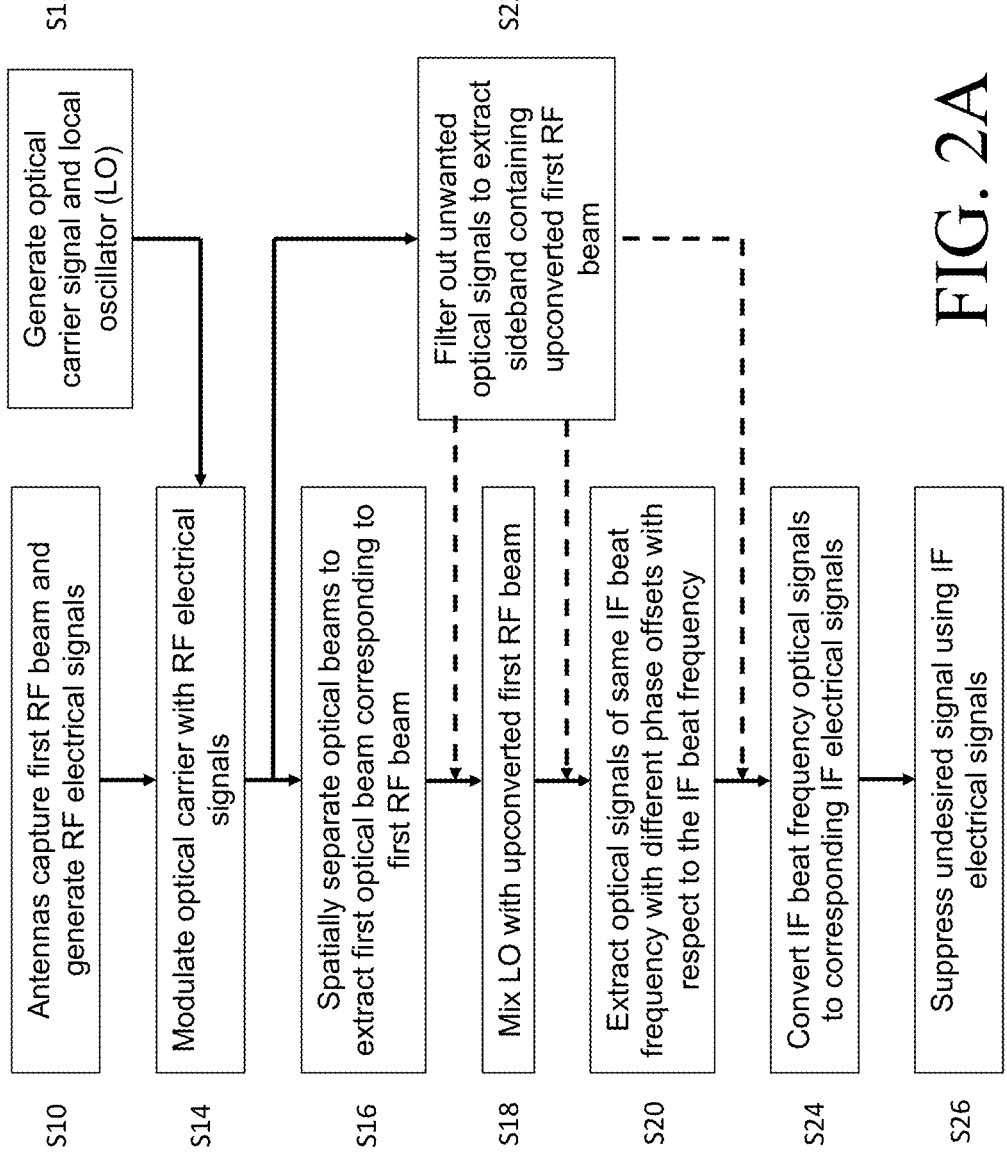

FIG. 2A

S10 Antennas capture first RF beam and generate RF electrical signals

S12 Generate optical carrier signal and local oscillator (LO)

S14 Modulate optical carrier with RF electrical signals

S16 Spatially separate optical beams to extract first optical beam corresponding to first RF beam S18 Mix LO with upconverted first RF beam S20 Extract optical signals of same IF beat frequency with different phase offsets with respect to the IF beat frequency S22 Filter out unwanted optical signals to extract sideband containing upconverted first RF beam S24 Convert IF beat frequency optical signals to corresponding IF electrical signals S26 Suppress undesired signal using IF electrical signals

PHOTONIC IMAGE REJECTION RF MIXER, A PHASED-ARRAY RADIO FREQUENCY RECEIVER IMPLEMENTING THE SAME AND RELATED METHODS OF OPERATION

RELATED APPLICATIONS

This application is a Non-provisional application of U.S. Provisional Patent Application No. 63/165,276, filed Mar. 24, 2021, the entire contents of which are hereby incorporated by reference.

TECHNICAL FIELD

This disclosure relates generally to wireless communication, and, in particular a photonic image rejection radio frequency (RF) mixer, a receiver that may receive signals using antenna phased arrays and methods of operation of the same.

BACKGROUND

Frequency mixing processes in wide-bandwidth systems suffer from the inherent problem known as "image signal interference." The problem arises when a system such as a wideband RF receiver is capable of receiving simultaneously many individual signals at different frequencies owing to the signals' narrower individual bandwidth. A second condition that contributes to the problem is that the operational bandwidth of the system is greater than the system's processing bandwidth, e.g. a system that receives and digitizes signals for analysis, where the digitization bandwidth is much less than the operational bandwidth (i.e., that of the RF components in the receiver chain, also called the "RF front end"). In such conditions, the received signal containing the full bandwidth is mixed with a tunable "local oscillator" (LO) in order to select a narrower portion of the full bandwidth for processing. For example, consider a hypothetical receiver whose RF front end captures 20 GHz of bandwidth spanning from 20 GHz to 40 GHz, and whose digitization bandwidth is 2 GHz. In such a system, if a signal of interest is received having a carrier frequency of 25 GHZ, the LO may be tuned to a frequency offset from this by ~1 GHZ, either 24 GHz or 26 GHZ, and the combined signal and LO fed to a mixer (a device with $2^{nd}$ order nonlinearity in its response) and optionally filtered to produce a downconverted version of the received signal whose carrier frequency is now the difference between the signal carrier and the LO, i.e. 1 GHZ, which is within the range accessible to the digitization hardware. The downconverted signal is referred to as the "intermediate frequency", or IF, signal. Likewise, the digitization bandwidth, 2 GHz in this example, may also be called the "IF bandwidth".

The image interference problem arises because in addition to the signal of interest at 25 GHz, another signal may be present at 27 GHz (causing interference with the 25 GHz signal when the LO has been tuned to 26 GHZ). This additional signal would be manifested as a so-called "image" because its frequency is separated from the LO by the same 1 GHz offset as the signal of interest, but on the other side of the LO frequency of 26 GHz. The mixer's down-conversion process does not discriminate among the desired signal and the image signal, rather they both produce 1-GHz downconverted mixer outputs, despite being separated by 2 GHz in the original RF spectrum. The image signal will interfere with the desired signal in the mixer output that is being digitized, and the result may be loss of signal fidelity, or a need for additional signal processing to overcome the interference, which comes at the cost of additional processing hardware (cost, size, weight, power) and latency (time required for processing). And further, even in the absence of an image signal, there is always thermal noise present over the entire operational bandwidth, and the mixer will add the noise from the region of spectrum near the image frequency to the IF signal, compromising the system's signal-to-noise ratio. Had the LO been tuned to 24 GHz in the example above, the image frequency of concern would have been 23 GHz instead of 27 GHz.

In conventional RF systems, there have been two general approaches to solving the image signal problem in real time: spectral filtering and interferometric cancellation. The former is simple and intuitive to understand. Once the desired signal frequency has been identified (25 GHz in our example), simply filter out the remainder of the operational bandwidth prior to mixing, using a tunable bandpass filter whose pass band width is matched to the IF bandwidth of the system. In practice, this approach suffers due to the performance limitations of real filters, particularly those that are tunable over wide bandwidths.

The second approach, interferometric cancellation, is generally implemented using a variant of the so-called Hartley architecture. In it, a pair of mixers is used, and their inputs are arranged to be identical apart from a 90-degree phase offset. This may be accomplished by splitting either the signal or the LO (but not both) using a 90-degree hybrid coupler, feeding the split outputs into one port of each of the two mixers, and feeding each mixer's other input using the remaining of either the LO or signal, split using an in-phase power splitter rather than a hybrid. Combining the mixers' outputs with an additional 90-degree hybrid coupler yields a combined output wherein the downconverted signal frequency ($f_{LO}-f_{signal}$) from each mixer combines in phase (or "constructively") while the downconverted image frequency ($f_{image}-f_{LO}$) combines 180 degrees out of phase (or "destructively"). To be effective, the cancellation approach requires precise balancing of the coupler ports, as well as precisely 90-degree phase offsets from the hybrids. In practice, these conditions are difficult to obtain over wide IF bandwidths, much less over the full RF operational bandwidth of wideband microwave/millimeter-wave systems; most couplers suffer from amplitude imbalance and phase errors when operated at frequencies away from their designed optimum. For this reason, particularly as extremely wideband RF systems continue to be developed and deployed with operational bandwidths that may exceed an octave and extend into microwaves and millimeter waves or beyond, photonic image rejection mixers (IRM) have been devised to exploit the inherent advantages of photonics: extremely large bandwidths with negligible dispersion/loss, light weight, immunity from electromagnetic interference, to name a few. Such advantages notwithstanding, there remain challenges and obstacles limiting photonic IRMs as well. A comprehensive summary of photonic IRM designs and their comparative advantages and disadvantages can be found in the review article by Zhu and Pan (*Photonics* 2018, 5(2), 6; doi: 10.3390/photonics502006.

An important feature of the photonic IRM design is an optical 90-degree hybrid coupler. In IRM designs proposed previously, photonic 90-degree hybrids have been implemented in various Mach-Zehnder interferometer (MZI) configurations, wherein an optical beam is split into two paths and then recombined with precise control of the difference between the optical lengths of the two paths. A versatile implementation of the MZI for use as an optical hybrid involves the use of integrated, dual-parallel MZI devices, wherein a pair of MZIs are nested within a larger outer MZI, with all optical paths confined within optical waveguides embedded in an electro-optic material that allows for precise, electrical control of the optical path lengths. The disadvantage of such implementations is that the splitters and couplers, as well as the waveguides themselves, are subject to perturbations due to small environmental changes such as temperature drift or acoustic/mechanical noise, which can be large enough in such sensitive electro-optic materials to perturb the precise phase conditions needed for interferometric image cancellation. This means that in practice such devices require active monitoring and feedback to maintain desired operation conditions, and these measures in turn add to a system's complexity, size and cost.

SUMMARY

An image rejection mixer (IRM) is formed by optically mixing an LO and an optical beam containing information in an interference space to extract a desired signal and suppress an undesired image signal formed during a down-conversion process. In some examples, the image rejection mixer is implemented in a receiver and the information of the optical beam is provided with an RF beam captured by an antenna array. The receiver may be an imaging receiver and the interference space of the IRM may be interference space of the imaging receiver used to spatially filter plural optical beams. In some examples, the interference space of the IRM is a star coupler. Related methods of operation of the IRM and receiver are also disclosed.

BRIEF DESCRIPTION OF THE DRAWINGS

For a more complete understanding of this disclosure, and the advantages thereof, reference is now made to the following descriptions taken in conjunction with the accompanying drawings, in which:

FIG. 2A illustrates exemplary operations of receiver 1000 comprising an image rejection mixer 800 in accordance with certain embodiments.

DETAILED DESCRIPTION

Figure 1A:
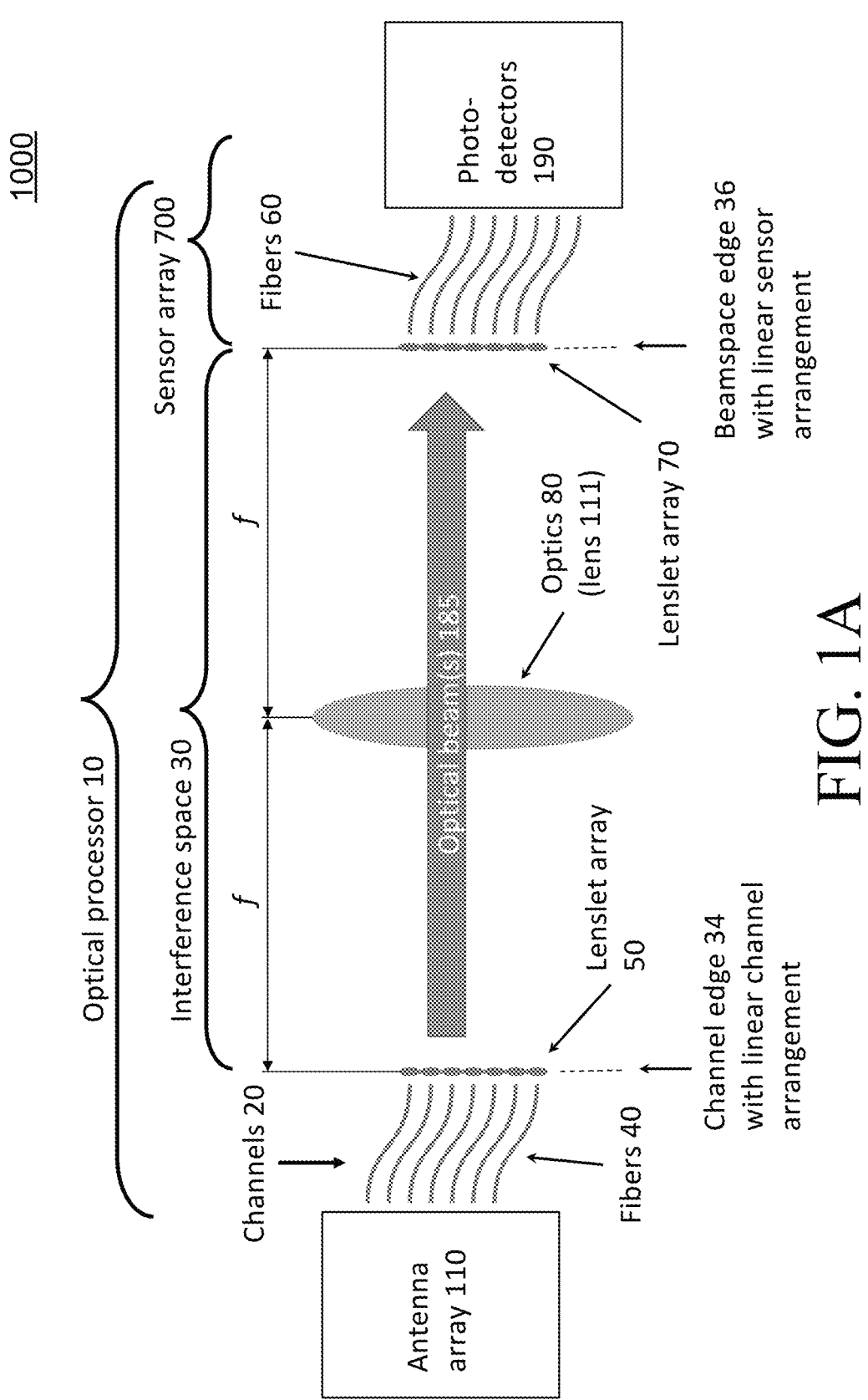
FIG. 1A highlights details of an optical flow path of receiver 1000 and FIG. 1B illustrates is a block diagram illustrating details of signal processing and related structure of the receiver 1000.

The present disclosure now will be described more fully hereinafter with reference to the accompanying drawings, in which various exemplary implementations are shown. The invention may, however, be embodied in many different forms and should not be construed as limited to the exemplary implementations set forth herein. These example exemplary implementations are just that—examples—and many implementations and variations are possible that do not require the details provided herein. It should also be emphasized that the disclosure provides details of alternative examples, but such listing of alternatives is not exhaustive. Furthermore, any consistency of detail between various examples should not be interpreted as requiring such detail—it is impracticable to list every possible variation for every feature described herein. The language of the claims should be referenced in determining the requirements of the invention.

Like numbers refer to like elements throughout. Reference numeral use of lowercase suffix "m" or "n" in this application may refer generically to any one of M or N similar elements (although, similar generic references may also avoid use of a "m" or "n" suffix). Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Though the different figures show variations of exemplary implementations, these figures are not necessarily intended to be mutually exclusive from each other. Rather, as will be seen from the context of the detailed description below, certain features depicted and described in different figures will be understood to be used with other features illustrated in other figures to result in various exemplary implementations.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.). Components described as being "electrically connected" (or "optically connected") are configured such that an electrical signal (or optical signal) can be transferred from one component to the other (although such signal may be attenuated in strength as it transferred, may be selectively transferred, may be transferred through duplication or splitting, and may be transferred when combined with other signals (i.e., as a component of a composite signal)).

Hereinafter, example embodiments will be explained in detail with reference to the accompanying drawings. The same reference numerals will be used to refer to the same elements throughout the drawings (and thus refer to both generic elements, species thereof and alternatives that may be described herein) and repeated description about the same elements may be omitted in order to avoid redundancy.

Figure 1B:
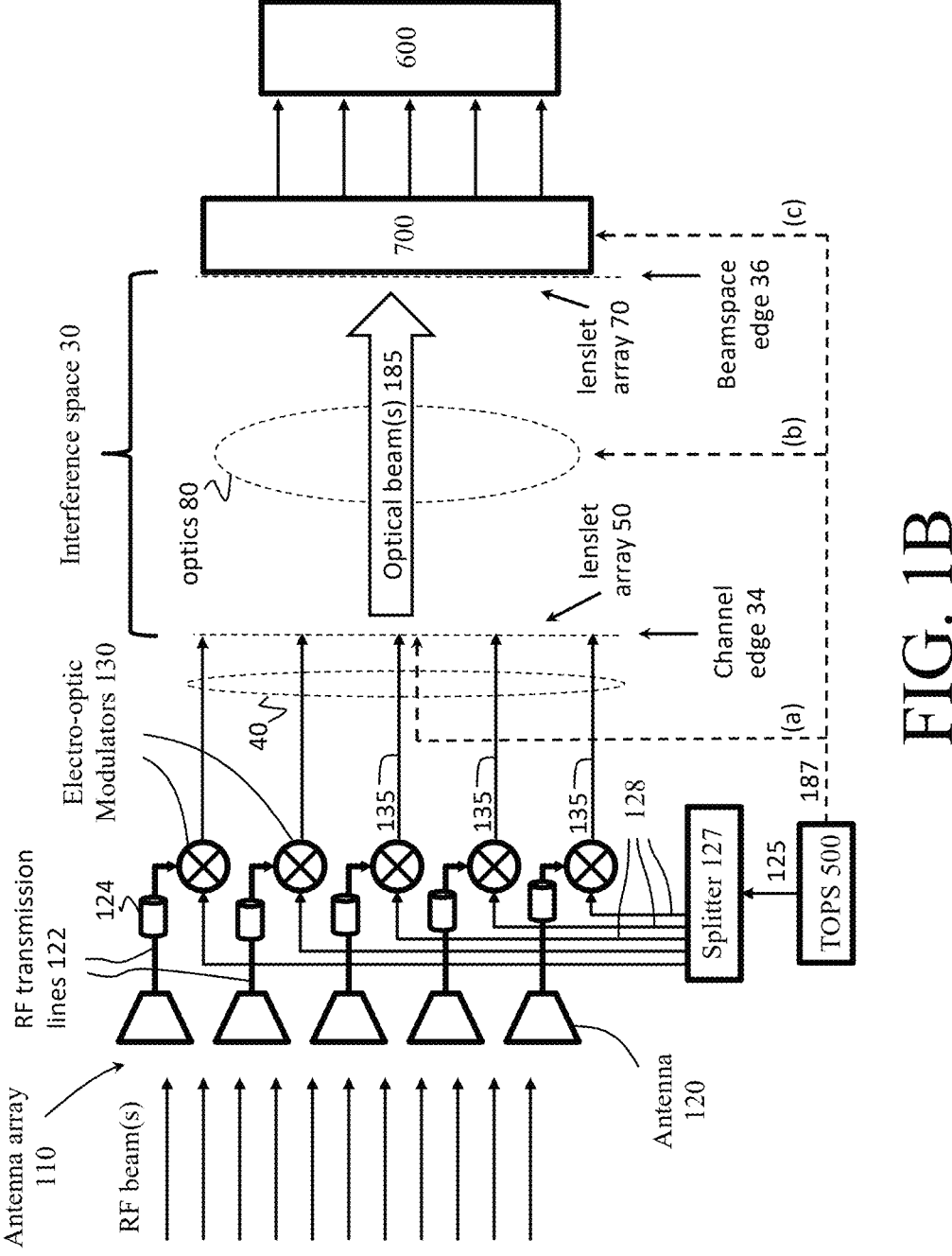
Figure 1C:
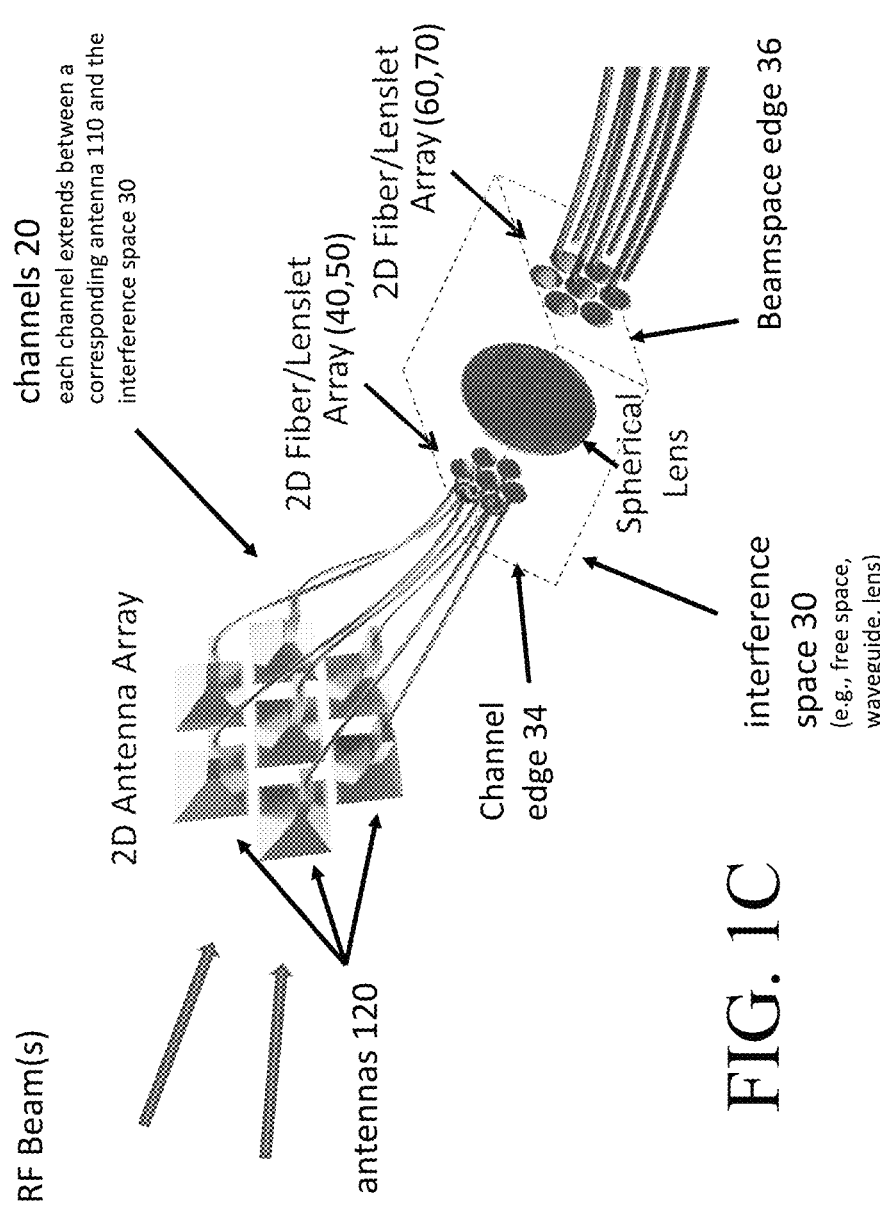
FIGS. 1C and 1D are perspective views representing different implementations of the receiver 1000.
Figure 1D:
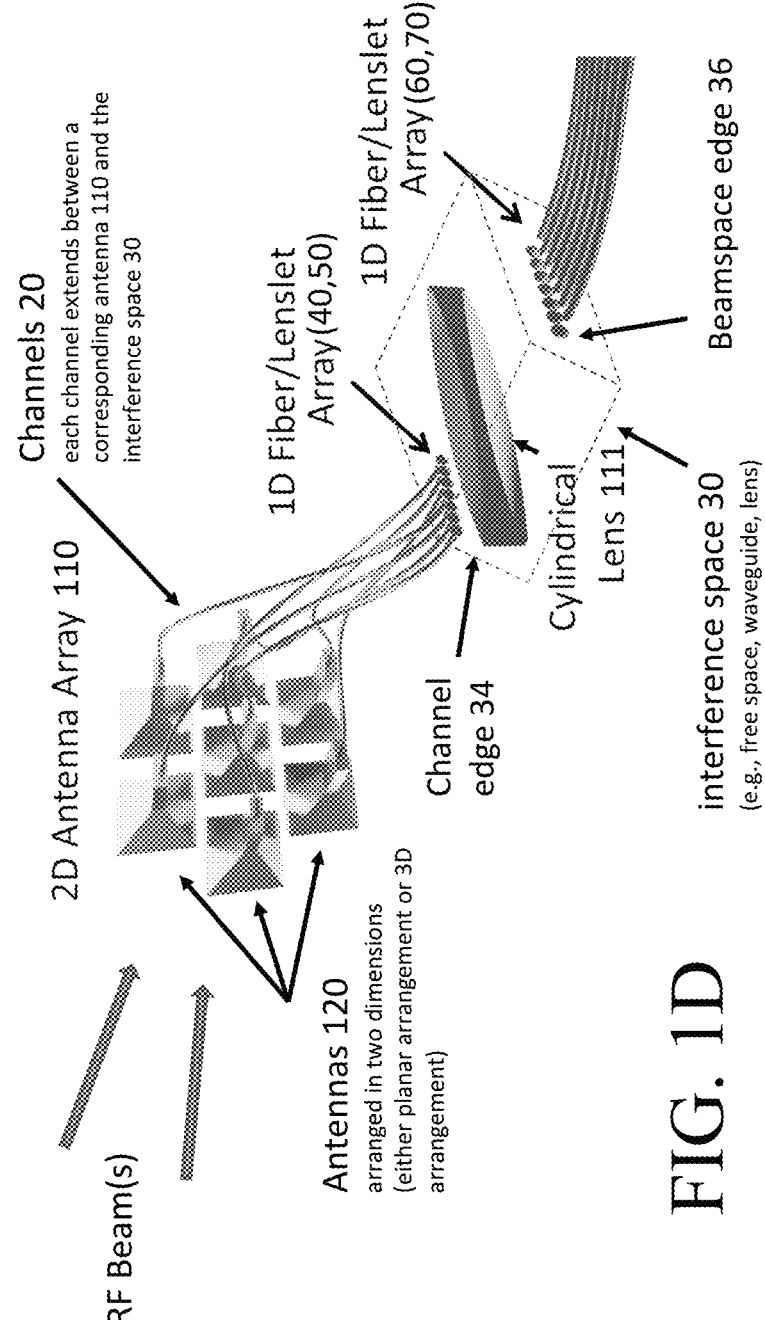
Figure 1E:
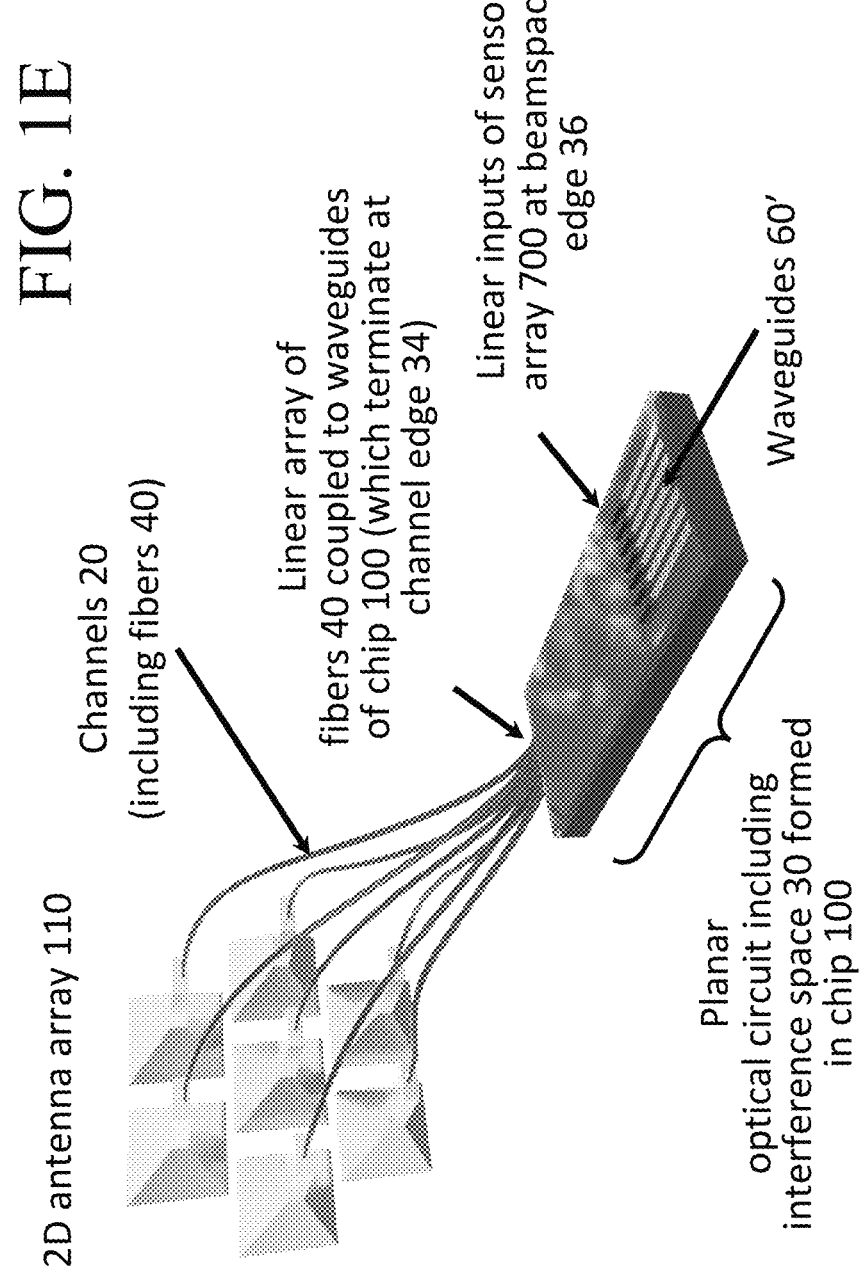
FIG. 1E illustrates receiver 1000 as embodied in a chip.

FIGS. 1A-1E illustrate exemplary details that may be implemented with a receiver 1000 having an optical processor 10. FIG. 1A highlights details of an optical flow path of receiver 1000 and FIG. 1B illustrates is a block diagram illustrating details of signal processing and related structure of the receiver 1000. FIGS. 1C and 1D are perspective views representing different implementations of the receiver 1000. FIG. 1E illustrates receiver 1000 as embodied in a chip. It will be appreciated that different structure of the receiver 1000 may be highlighted in the different figures of this application that may not be shown in others of these figures, although still being applicable. Specifically, the disclosure with respect to FIGS. 1A, 1B and 1E may be implemented with the receiver configuration of FIG. 1C as well as with the receiver configuration of FIG. 1D.

The receiver 1000 comprises an imaging receiver that may form an image of the RF scene captured by a phased array antenna array, to spatially separate (spatially filter) different RF sources from one another (even if transmitted and received at the same or overlapping RF frequencies). The receiver 1000 may comprise the structure of and perform the operations of the imaging receivers that are described in U.S. Pat. Nos. 9,800,346, 11,205,843 and/or U.S. Patent Pub. No. 2021/0257729, modified to also include the image rejection mixer (IRM) and/or associated operations of the image rejection mixer described herein—each of these patent documents being incorporated by reference in their entirety for their teaching of exemplary structure and operations thereof that may be implemented with the receiver 1000. These photonic imaging receiver systems have been developed using free-space optics to efficiently perform RF/microwave beamforming.

It should be noted that the term "image" and its derivations is used to refer to different aspects that may be employed by the present invention. A first use of "image" refers to optical systems designed for photonic "imaging" receivers. In this usage, "image" refers to a spatial mapping of the signals received by the imaging receiver, e.g., spatially separating or filtering of received RF signals based on their angle of arrival at the antenna array. An imaging receiver need not actually form a visual image (e.g., a 2D visual representation of the RF scene) or otherwise provide a 2D mapping of a scene.

A second use of the term "image" occurs with respect to "image" rejection (where "image" refers to frequencies whose spectral location is mirror-symmetric to that of a signal of interest, with respect to the LO in a mixer). The image rejection mixer (IRM) of the present invention refers to this latter use of the term "image" and should not be understood to refer to the former usage.

In the receiver 1000, a lens may be located one focal length from an array of optical fibers, which carry upconverted RF signals captured by a phased-array antenna, and whose arrangement, in some examples, matches the antenna array's arrangement at reduced scale. Said lens performs a spatial Fourier transform, wherein the signals in the fibers overlay to form an interferogram on the far side of the lens. Since the individual antenna elements of the array all receive the same RF input signals (deviating only in phase), the optical signals in the output fibers are identical apart from their phases. Their relative phases are determined by the combination of the various RF input signals' angles of incidence upon the antenna array (a.k.a. angle of arrival, AoA), and each antenna's location within the array's overall aperture. The spatial Fourier transform operation converts these relative phases into an interference pattern where constructive interference occurs at locations in the image plane that map onto directions of signal incidence onto the aperture plane (which is replicated in the lens's object plane via the fiber array).

FIG. 1A illustrates provides an overview of a receiver 1000 according to embodiments of the present invention, including an optical processor 10 connected to a 2D antenna array 110. Although the description is in connection with an optical processor, the invention is not limited thereto and applies to other processors that process signals in realms other than optical (e.g., acoustic, electrical, etc.) For example, the invention also applies to all-electronic systems where a 2D antenna array is mapped into a 1D array of channels, e.g., RF waveguides or RF transmission lines which terminate along a line or curve, and then are processed in an RF interference space using planar techniques, e.g., with a Rotman lens or Butler matrices.

A 2D antenna array 110 is formed of a plurality of antennas 120 (horn antennas in this example) arranged in at least two dimensions. Note that the antennas 120 may be arranged in two dimensions in a single plane (i.e., restricted to two dimensions) or may be arranged in three dimensions, such as regularly arranged on a curved surface, such as on a hull of an aircraft or vehicle. In addition, the array arrangement may include the temporal dimension by employing different delays in different-length optical fibers or waveguides, as disclosed in U.S. Pat. No. 10,009,098, or U.S. Pat. No. 10,218,438, or U.S. Pat. No. 10,313,012, each of these patents being incorporated herein by reference in its entirety. Unless context indicates otherwise, reference to a 2D antenna array herein should be understood to refer to an arrangement of antennas distributed in at least two dimensions, but need not be confined to only two dimensions (i.e., refers to both an arrangement of antennas distributed in two dimensions in a plane or an arrangement of antennas in three dimensions). It should be appreciated that the 2D antenna array 110 formed of a plurality of antennas 120 may also be referred to itself as an antenna (e.g., a phased array antenna). For clarification, an individual antenna of an antenna array may also be referred to herein as an "antenna element" (depending on context, "element" by itself may refer generically to other structure, such as a transducer/sensor/radiating arm that may be a part of an antenna element or may be part of some other structure).

The antennas 120 are communicatively coupled to an interference space 30 via corresponding channels 20. For example, the optical processor 10 maybe implemented in a receiver 1000 where electromagnetic radiation (e.g., RF beams) are captured by the antennas 120 and converted to RF electric signals, which are then upconverted to optical signals by electro-optic modulators (not shown in FIG. 1A) and transmitted to the interference space 30 by optical fibers 40 (or other optical waveguides). The interference space 30 may be free space (e.g., air or a vacuum), a waveguide (e.g., slab waveguide) or other medium that allows transmission of the optical signals to allow the optical signals within the interference space 30 to interfere with one another. A reference optical beam (not shown in FIG. 1A), offset in frequency from the information-carrying optical signals (e.g., encoded signals) is combined with the information carrying optical signal to heterodyne the same to facilitate conversion of the information-carrying optical signals to corresponding RF electrical signals. Such information-carrying signals may be information provided by the antennas 120 and conveyed in parallel via channels 20, including fibers 40. The reference optical beam may be provided before the interference space, within the interference space, or at or after the interference space 30 (see FIG. 1B).

The light transmitted through the interference space 30 is captured and downconverted to an RF electrical signal by photodetectors 190 of sensor array 700. The interference of light within the interference space 30 provides an interference pattern at a beamspace edge 36 (e.g., a focal surface or an image plane), at which inputs of the sensor array 700 are arranged (e.g., lenslets 70 in the configuration of FIG. 1A). The interference pattern of light thus captured by sensor array 700 is converted to corresponding RF signals by photodetectors 190 (such as photodiodes—not shown), each corresponding to the intensity and phase of an RF beat signal resulting from interference of the reference optical beam and the upconverted optical signals.

FIG. 1B illustrates an optical source 500 configured to generate an optical carrier signal 125 (e.g., a primary laser) and a reference optical signal 187 (a secondary laser). The optical carrier signal 125 has a first frequency and the reference optical signal 187 has a second frequency. In terms of the image rejection mixer 800 described herein, the reference optical signal 187 acts as a local oscillator for a down-conversion process (further details described elsewhere herein) and may be also be referenced as "local oscillator" or LO. The first frequency and second frequency differ by a set amount (where this difference in frequency may be set by an input to the optical source 500, such as by a user input (e.g., programmed)). In addition, the optical carrier signal 125 and the reference optical signal 187 may be phase-locked to each other. For example, a variation in phase in the optical signal 187 produced by the primary laser may cause the same variation in phase in reference optical signal 187 of the secondary laser. The optical source 500 may be a tunable optical pair source (TOPS) such as disclosed in "Radiofrequency signal-generation system with over seven octaves of continuous tuning," authored by Schneider et al., and published in Nature Photonics, online Jan. 20, 2013, and/or as disclosed in U.S. Pat. No. 10,965, 100, issue Mar. 30, 2021, the contents of each of which is hereby incorporated by reference in its entirety.

The optical carrier signal 125 is split M ways by a splitter 127 and the resulting beams 128 are routed through electro-optic modulators 130 coupled to antennas 120 capturing the RF radiation (e.g., capturing one or more RF beams from corresponding RF sources in the real world external to the receiver 1000). Each antenna 120 provides an RF electrical signal to a corresponding modulator 130 that modulates the optical carrier signal. The output 135 of each modulator 130 is a modulated optical signal containing the optical carrier signal wavelength (corresponding to the wavelength of the primary laser of optical source 500) and optical sidebands imprinted with the RF electrical signal provided by the corresponding antenna 120 to which the modulator 130 is connected (such RF electrical signal corresponding to the RF radiation captured by that antenna 120). These optical sidebands may be (or contain) an upconverted optical sideband representing the up-conversion of the RF electrical signal (provided to a modulator 130) to a higher frequency optical signal that contains information provided by the RF electrical signal. The outputs 135 are conveyed by optical fibers 40 to a lenslet array 50 coupled to the outputs of the fibers 40. The lenslet array may be arranged in a pattern corresponding to the pattern of the antenna array (e.g., as shown in FIG. 1C) or in a linear pattern (e.g., as shown in FIG. 1D). The optical fibers 40 and lenslet array 50 may be collectively referred to herein as a fiber/lenslet array. The lenslet array 50 is arranged at an edge 34 of the interference space 30 at which channels 20 terminate (e.g., arranged at the termination of optical fibers 40 at lenslet array 50), which may be referred to herein as the channel edge 34.

The signal path between an antenna 120 and a corresponding lenslet of the lenslet array 50 that is operatively coupled to such antenna 120 forms a channel 20. Ends of the plurality of channels 20 may be arranged in a 2D pattern corresponding to the pattern of the antenna array 120 (e.g., as shown in FIG. 1C) or linearly arranged in a single line in an order related to the 2D arrangement of the antennas 120

(e.g., as shown in FIG. 1D). It should be noted that for ease of description, the arrangement of the ends of channels 20 at interference space 30 may simply be referenced as the "channel arrangement" or similar description (although it will be recognized that channels 20 need not maintain this arrangement along the entire length of the channels 20). Similarly, unless context indicates otherwise, reference to the ends of channels 20 (or similar description) will be understood to refer to the ends of the channels 20 at the interference space 30.

Each RF beam captured by the antenna array 110 is transmitted as a corresponding virtual beam via channels 20. Multiple virtual beams (representing multiple RF beams) may be simultaneously transmitted by channels 20 via superposition of signals forming the virtual beams in the channels 20. Each virtual beam is then transmitted into the interference space 30 to form a corresponding optical beam to represent a corresponding RF beam.

As noted with respect to FIG. 1D, the arrangement of the ends of channels 20 at interference space 30 may be regularly spaced apart (e.g., regularly spaced in a 1×N array) along a line (a straight line or a curved line). However, the arrangement of the antenna elements 120 may be regularly spaced apart in two dimensions (e.g., regularly spaced apart in each of two directions of a two dimensional array forming antenna array 110). While the relative positions of the antenna elements 120 and those of the ends of channels 20 do not correspond to each other, the information processed by the optical processor 10 is maintained as if they did correspond to each other. For example, the channels 20 (i.e., ends of channels 20 corresponding to the lenslets 50 in this example) may be arranged along a line (a straight line or a curved line) that lies within a first plane and a propagation direction of optical signals within the optical processor 10 may also lie within this first plane. It should be appreciated that reference herein to linear may include curvilinear and similarly, reference herein to a line may encompass both a straight line and a curved line, unless context indicates otherwise. The AB transformer represented in the receiver of FIG. 1D, the corresponding processing and related structure is described in detail in U.S. Patent Pub. No. 2021/0257729, incorporated by reference in its entirety.

As represented in FIG. 1E, all or part of the optical processor 10 may be formed within a single chip, such as in a photonic integrated circuit (PIC) and/or be implemented in a planar optical circuit of a semiconductor chip (having electronic integrated circuits and/or electronic components formed therein as well). When all or part of the optical processor 10 is formed as part of a single chip, propagation direction(s) of optical signals within the chip may be in parallel to the substrate of the chip (e.g., the propagation directions of the optical signals may be confined to two dimensions, e.g., confined to horizontal transmission when a direction perpendicular to the substrate of the semiconductor chip is considered to be the vertical direction). The optical processor 10 need not require three dimensional optical processing when the receiver 1000 implements the AB transformer represented in FIG. 1D, thus may be more easily formed in a chip or other planar optical circuit. It should also be appreciated that the invention may be implemented using several interconnected semiconductor chips and/or at package level and/or by patterning and formation of its elements (e.g., of waveguides and interference space) in a printed circuit board.

Referring back to FIG. 1B, the ends of the plurality of channels 20 (the outputs of the optical fibers 40/the lenslet array 50), the optical signals output by each optical fiber 40 propagate in interference space 30 (e.g., free space or slab waveguide). As such, these optical signals are no longer guided by the optical fibers 40 and may thus interfere with each other and form one or more optical beams 185 in the interference space 30 (each optical beam 185 corresponding to an RF beam captured by the antenna array 110). While certain embodiments are illustrated and described as being implemented with conventional optical fibers, other optical waveguides or channels may be used in place of optical fibers.

Upon transmission into the interference space 30, each optical beam 185 may have the form of a plane wave with a direction of propagation determined by the corresponding RF beam to which it corresponds. The optical beams 185 formed in the interference space 30 may be subject to various optical devices 80 (e.g., lenses, filters, beam splitters, beam combiners, etc.) in the interference space. For example, optics 80 may include one or more discrete lenses 111 that focus the optical beams 185 formed in the interference space 30 to produce one or more spatially separated optical beams 185. Specifically, each RF beam from different RF sources may arrive at the antenna array 110 at different angles of arrival (AoA), so that each RF beam is captured by different antennas 120 at different times by each antenna, and more specifically, resulting in RF electrical signals having different phase offsets which are preserved when output into the interference space. As such, each RF beam may be represented by an optical beam 185 that is spatially separated from other RF beams in the interference space 30. The spatially separated optical beams 185 may be focused on a beamspace edge 36 of the interference space 30 (which may correspond to a focal plane or image plane of the optical processor) and detected with corresponding sensors of a sensor array 700.

Commonly, 'beam,' as in 'beam of light,' may be understood as electromagnetic radiation that is confined laterally in space and propagating in a particular direction to form, for example, a straight line in free space. Since physics may prohibit perfect lateral confinement in homogeneous linear media over arbitrary propagation lengths, we deviate slightly from this 'common' understanding, and allow for beam divergence along the propagation direction. Thus, for an incoming RF beam detected by antenna array 120, 'beam' may be understood as a propagating wave that appears approximately as a plane wave at the receiving antenna location and antenna extent. Optical beams 185 formed in interference space 30 may similarly diverge or converge along the propagation direction. Practical considerations of phased arrays, and finite aperture size in general, may introduce additional complexities to the beam shape, i.e., the amplitude and phase variation of the electromagnetic field in the plane perpendicular to the direction of beam propagation. For example, phased arrays with a regular (periodic) distribution of radiating elements may produce grating lobes, i.e., waves propagating in directions inversely related to the element spacing; or side lobes, i.e., waves propagating in directions related to the lateral extent of the aperture and variation in amplitude and phase of the signals radiated by the individual elements, in addition to the 'main lobe' which is the wave transmitted in the intended direction. Although the collection of all the lobes, i.e. the main lobe, the grating lobes, and the side lobes, may be considered to constitute a beam, it should be understood that reference to the direction of such a beam herein corresponds to the direction of the main lobe, unless context indicates otherwise.

Mixing the optical beam(s) 185 with reference beam(s) 187 from the optical source 500 allows for the extraction of information carried in the optical beam(s) 185 modulated with incoming RF signal(s). FIG. 1B illustrates three options (a), (b) and (c) for mixing the optical beam(s) 185 with a reference beam 187, that will be described in more detail below.

The optical outputs 135 of the modulators 130 may be filtered with a filter 112 to allow only a single sideband corresponding to the captured RF radiation to pass (using filter 112 in each of the channels 20 or in the interference space 30, e.g.). The filter 112 can be placed anywhere between the modulators 130 and the detectors 190. In some examples, filter 112 may be part of optics 80 in the interference space 30 downstream of the lenslet array 50. Furthermore, in some embodiments, especially for frequencies lower than ~5 GHZ, a Mach-Zehnder modulator (MZM) may be used for filter 112 to filter out the sideband energy from the optical carrier energy. Such modulators can, under appropriate bias conditions, interferometrically suppress the carrier while passing the (odd-ordered) sidebands, thereby suppressing the carrier in a frequency-independent manner. It will be appreciated that the filter 112 may be positioned in the interference space 30 or further downsteam in the optical path and as such, the optical carrier signals and both sidebands (two upconverted optical signals) are output into interference space 30. When the filter 112 is positioned upstream of the interference space 30, only a single sideband (i.e., only an upconverted optical signal) of the output of a modulator 130 may be output by an optical fiber into the interference space 30. In any of these implementations, the description may refer to an upconverted optical signal being input into the interference space 30 (i.e., whether or not this upconverted optical signal forms part of a larger composite optical signal, such a composite optical signal generated by the modulator 130 containing the optical carrier signal and both sidebands).

Inputs of sensors of sensor array 700 may be arranged in two dimensions (FIG. 1C) or linearly arranged (FIG. 1D) at the beamspace edge 36 of interference space 30. Each sensor of the sensor array 700 may include one of the detectors 190 and, in some examples, optics, such as lenslets 70 and/or optical fibers 60. The optical fibers 60 and lenslet array 70 may be collectively referred to herein as a fiber/lenslet array. Each optical beam 185 may be captured by a corresponding one of the sensors at the beamspace edge 36 (e.g., at a focal surface of the optical processor 10) and be detected by a corresponding one of the detectors 190 (which may form part or all of the sensor array 700). Each detector 190 may be a photodiode or another type of photodetector. Sensors of sensor array 700 may have different forms such as being formed of detectors 190 only (positioned at the beamspace edge 36), a lenslet/detector combination (positioned at the beamspace edge 36) and a lenslet (positioned at the beamspace edge 36) coupled to a photodetector via an optical fiber. FIG. 1A illustrates sensor array 700 comprising a lenslet array 70 coupled to photodetectors 706 via output fibers 60.

In alternative configurations, the sensor array 700 may comprise photodetectors 190 arranged at the beamspace edge 36 to capture and sense the optical beams 185 formed at the beamspace edge 36. The arrangement of the photodetectors 190 may correspond to an arrangement of the inputs of the sensor array as described herein. Each photodetector 190 may optionally optically coupled to the interference space 30 with lenslets 70 with the same arrangement as the photodetectors 190. Fiber array 60 (or equivalent optical waveguides) may be omitted from the sensor array 700 in these alternative configurations.

In the receiver 1000, optical processor 10 may comprise the fiber/lenslet array 40/50 (forming part of channels 20) that convey the modulated signals 135 output by modulators 130, the interference space 30 and optics 80 formed therein, and any optical transmission path of sensor array 700 (e.g., the fiber/sensor array 60/70 of sensor array 700 when implemented with the same). The receiver 1000 may be implemented with an AB transformer that may comprise antenna array 10, channels 20 and the fiber/lenslet array 50. Together, the structure of the optical processor 10 and AB transformer 1 of the receiver 1000 may be referred to as a beamspace processor.

An RF source external to the receiver 1000 may emit a signal in the form of a radiated electromagnetic wave (RF radiation) (also referenced herein as an RF beam) and may be captured by the antenna array 110. To extract or recover information encoded in an RF beam captured by the antenna array 110, the corresponding optical beam 185 (also containing this encoded information) is combined with a reference laser beam 187 for heterodyne detection by photodetector 190. A few examples of non-spatial information encoded into an RF signal that may be detected by a photodetector 190 include amplitude, phase, and/or frequency modulation of an RF carrier with an information-bearing signal. The information-bearing modulating signal may be analog or digital. The information may be contained in frequency-division multiplexed, time-division multiplexed, or code division multiple access signals (FDM, TDM or CDMA respectively; using telecommunication examples for more specificity for each, e.g., OFDM, GSM, or WCDMA signals). For example, each photodetector 190 may receive an optical beam 185 corresponding to a different RF beam received by the antenna array, with each RF beam providing an OFDM signal comprising multiple carrier signals that are orthogonal to each other. A single photodetector 190 of sensor array 700 may extract the OFDM signal containing the multiple carrier signals as an RF electrical signal which may be appropriately demodulated (e.g., to baseband) to extract data (e.g., a digital data comprising binary bits of 0's and 1's). Each OFDM signal received by each photodetector 190 may comprise multiple channels of data, each associated with a different transmission (e.g., each associated with a different audio signal or different video signal). As is known, a channel of digital data need not be carried by a single carrier but may be spread across multiple ones of these carriers (e.g., via frequency hopping or interleaving). The RF carriers of the same frequency (e.g., of the OFDM signals) may be simultaneously transmitted by the RF sources and captured by different sensors of sensor array 700; interference amongst the simultaneously received OFDM signals (transmitted at the same RF carrier frequency) may be avoided due to the spatial separation of the resulting optical beams 185 at beamspace edge 36. Each OFDM signal received by each photodetector 190 may correspond to an OFDM RF signal transmitted by one or more of the RF sources and received by antennas 120 (e.g., in the millimeter wavelength RF range, or in a range of 3 to 300 GHz, or between 0.5 to 300 GHz, such as 0.5-110 GHz, or in the HF band of 3 to 30 MHz, or in VHF band of 30 to 300 MHZ, or in UHF band of 300 MHz to 1 GHz). Thus, for example, antennas 120 may receive multiple OFDM RF signals (via corresponding RF beams), each OFDM RF signal having multiple channels to carry multiple transmissions of digital data on multiple signal carriers, such as digital audio (e.g., MP3, MPEG), digital images, digital video (e.g., MP4), data in TCP/IP format, etc. Optical conversion and processing (as described herein) may convert each of these RF OFDM signals to a corresponding one of optical beams 185 at the beamspace edge 36 to different, spatially separate location on the inputs of sensor array 700 at beamspace edge 36. Thus, even when implemented with the same carrier frequency, different RF beams from different RF sources may be simultaneously captured by the antenna array 110 and provided to a different corresponding photodetector 190 as a converted optical beam 185 (corresponding to one of the RF beams from an RF source that is captured by the antenna array 110). Thus, a plurality of received RF beams from different RF sources can be processed simultaneously to extract or recover information provided by these RF beams, even if provided at the same RF carrier frequency (or substantially the same that would interfere with processing if not spatially separated).

The RF signal(s) extracted by photodetectors 190 may be provided to processor 600 after being downconverted to a baseband signal by an image rejection mixer and converted into digital form by an analog to digital converter. Processor 600 may be a general purpose processor (e.g., a computer, microprocessor, CPU, GPU, etc.) or special purpose processor (e.g., a digital signal processor), and may be hardware configured by software or hardware circuitry (e.g., an integrated circuit). Processor 600 may be formed of by one processor or several interconnected processors. Processor 600 may determine the RF beam angle of arrival (at the antenna array 110) based upon photodetector 190 that provides the RF signal to the processor 600. That is, the optical processor 10 is configured such that a predetermined relationship exists between the location of an optical beam 185 as focused on the sensor array 700 at the beamspace edge 36 (e.g., a focal plane of the optical processor 10)—which may correspond to a location of a sensor of the sensor array 700—and the angle of arrival of the RF beam to thus allow the processor 600 to determine the angle of arrival of the RF beam. Thus, a location of an optical beam 185 at the beamspace edge 36 (e.g., formed as a discrete spot) along the linear arrangement of the sensors of the sensor array 700 may be used to determine the angle of arrival of the RF beam by the processor 600. For example, when the ends of the channels 20 at the channel edge 34 of the interference space 30 are in a pattern that corresponds to the pattern of the antennas 120 of the antenna array 110 (such as shown in FIG. 1C), the image of the RF scene captured by the antenna array 110 may correspond to an optical image at the beamspace edge 36. Thus, spatial separation of the RF sources in the real world transmitting RF beams to the receiver 1000 results in corresponding spatial separation of the optical beams 185 at the beamspace edge 36 (such optical beams 185 being captured by sensors of the sensor array 700). The ends of the channels 20 at the channel edge 34 of the interference space 30 are not required to be in the same pattern as the antennas 120 of the antenna array 110, such as shown in FIG. 1D.

FIG. 1B shows antenna elements 120 may be connected to a corresponding electro-optic modulators 130 via a plurality of RF transmission lines 122 through respective RF connectors 124. The RF connectors 124 may allow decoupling the antennas 120 from the modulators 130, and may be provided anywhere between the antennas 120 and the modulators 130, such as between the antennas 120 and the input end of the RF transmission lines 122, between the output end of the RF transmission lines 122 and the modulators 130 or inserted between RF transmission line segments forming the RF transmission lines 122. The optional use of RF connectors 124 may facilitate the reconfiguration of the receiver 1000 so that the receiver 1000 may be used with other antennas that operate at different RF carrier frequencies (i.e., e.g., antenna array 110 may be replaced with another antenna array by a user and the receiver 1000, using a new antenna array may operate using the same optical processor 20).

The reference optical beam 187 may be combined with beams 185 in different ways (illustrated by three branches (a), (b) and (c) of dashed lines 187 in FIG. 1A). Only one of these options need be implemented in the receiver 1000. The first branch (a) represents the option of the reference beam 187 being input into the interference space 30 together with the upconverted optical signals provided by the fibers 40 at the beamspace edge 134, as will be described further with respect to FIG. 4A. Alternatively, as represented by the second branch (b), the reference beam 187 may be input into the interference space at a location different from the beamspace edge 34 and combine via an optical combiner (part of optics 80 in the interference space 30). Such an implementation is described further with respect to FIG. 5. In both implementations (a) and (b), reference beam 187 interferes with the upconverted optical beams (which form each optical beam 185) in the interference space 30. Alternatively, as represented by the third branch, the reference beam 187 may combine with beams 185 after they are captured (e.g., passively captured) by sensors of sensor array 700 at the beamspace edge 36 (e.g., at the focal plane of processor 10) but prior to their conversion to an electrical signal by a photodetector 190. This implementation is described further with respect to FIG. 3.

The receiver 1000 described herein may operate and communicate with a wide range of radio frequencies, such as millimeter wave (e.g., about 30 to 300 GHz), microwave (e.g., 1 to 170 GHz), SHF (3 GHz to 30 GHz), UHF (300 MHz to 3 GHZ), VHF (30 to 300 MHz), to radio frequencies as low as 300 KHz or even 30 KHz. Receiver 1000 may dynamically change a range of RF carrier frequencies that are processed in real time. However, real time alteration of the carrier frequency will be limited by the operational frequency range of the antenna 120 of the antenna array 110. As such, the antenna array 110 may be physically replaced with other antennas 110 (e.g., having a different operational frequency range) by a user and/or electronically switched (whether automatically in response to a program or algorithm, or by a user in response to a user input) to connect the remaining portions of the receiver 1000 to one of several existing different antenna arrays 110).

The light beams 185 and 187 described herein may be visible light or invisible light (e.g., infrared, ultraviolet). Use of other waveguides other than fiber optics may also be implemented. Widespread availability and ease of use of fiber optics may make such waveguides preferable for optical waveguides. Waveguides formed in a photonic integrated circuit (PIC) may be preferred when all or part of the optical processor 10 is formed in a chip (e.g., with a PIC) using conventional integrated circuit manufacturing technologies.

Figure 2B:
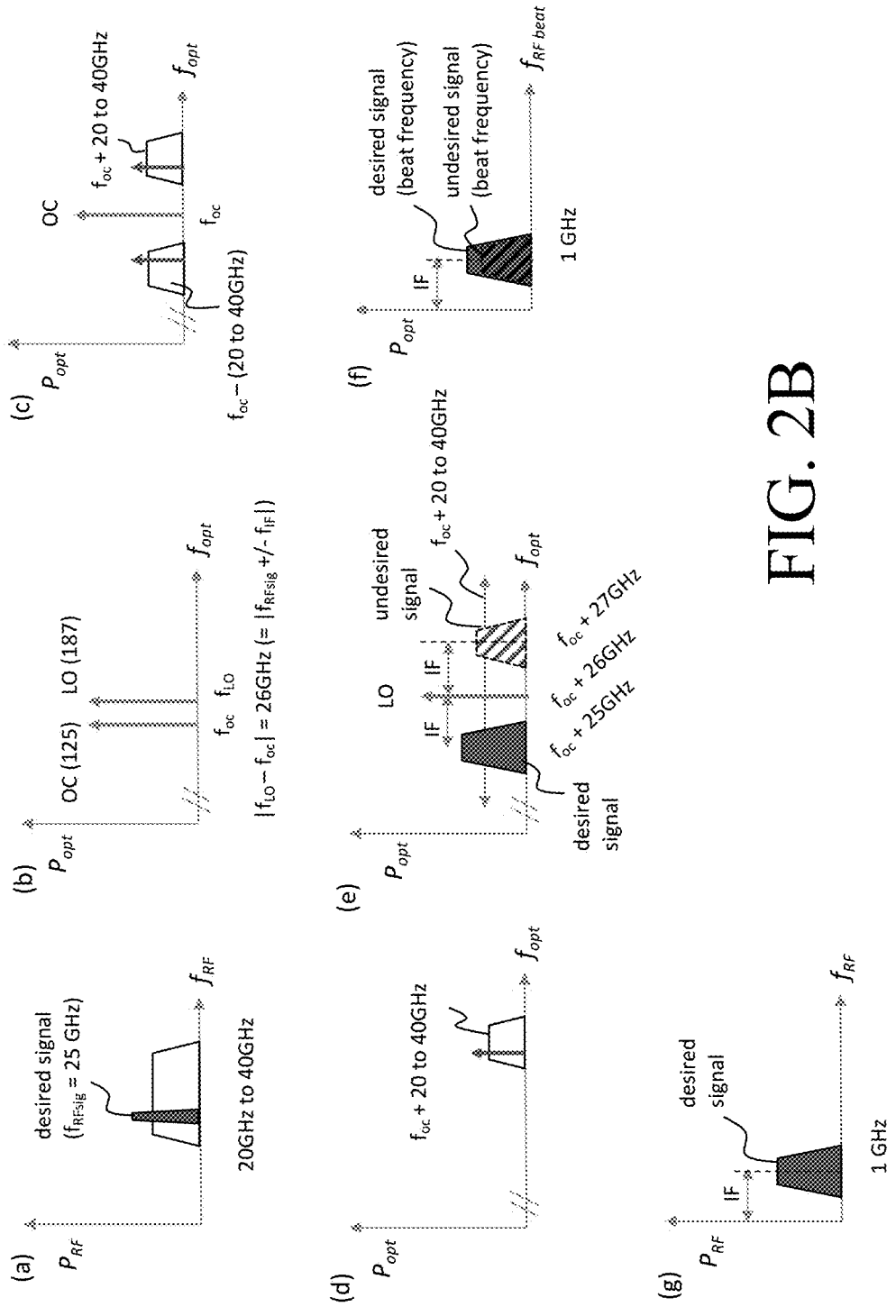
FIG. 2B provides a series of spectral plots to illustrate exemplary signal processing that may be performed by receiver 1000 including an image rejection mixer 800 in accordance with the method of FIG. 2A.
Figure 2C:
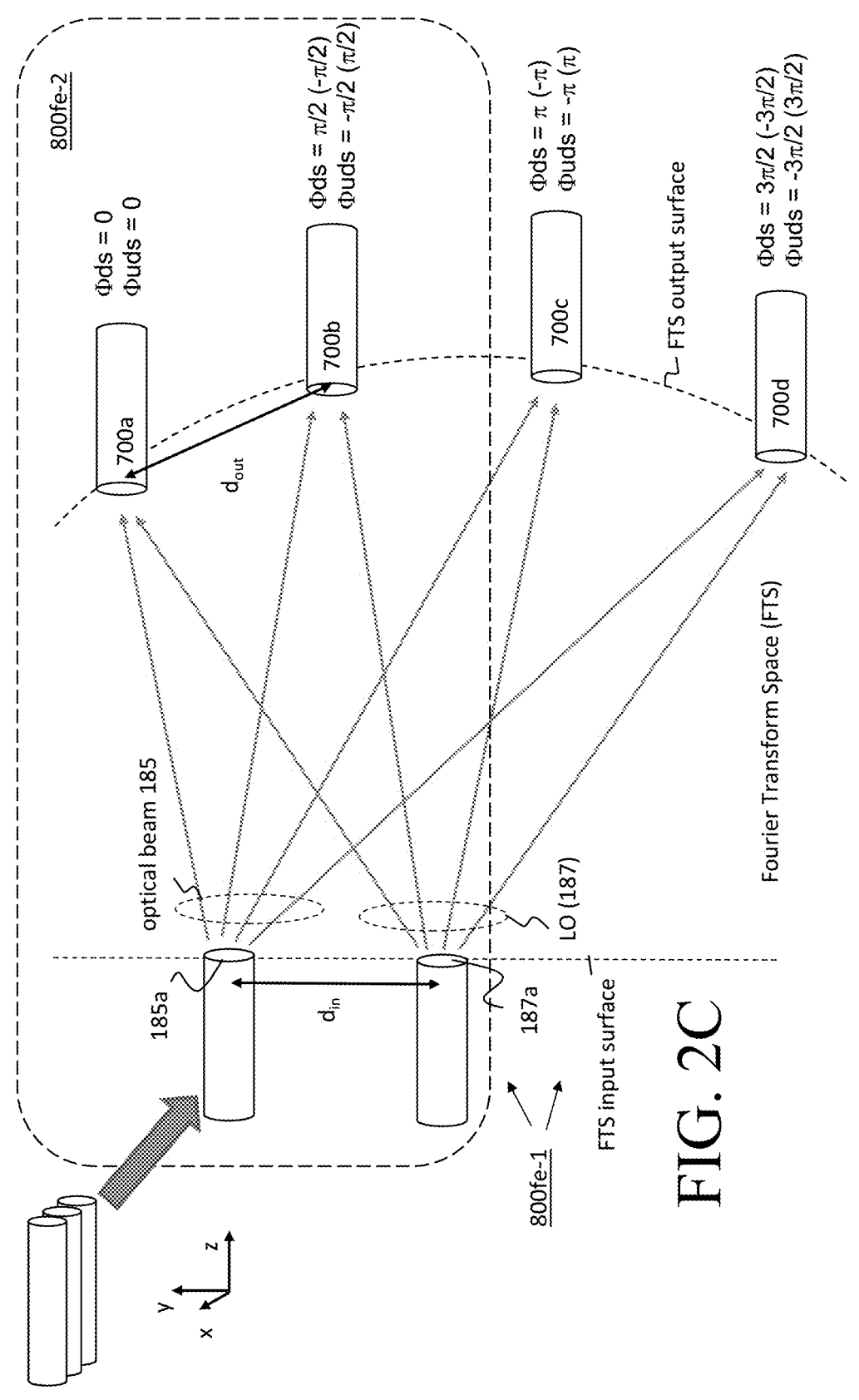
FIGS. 2C-2E illustrate exemplary structure of an image rejection mixer 800.
Figure 2D:
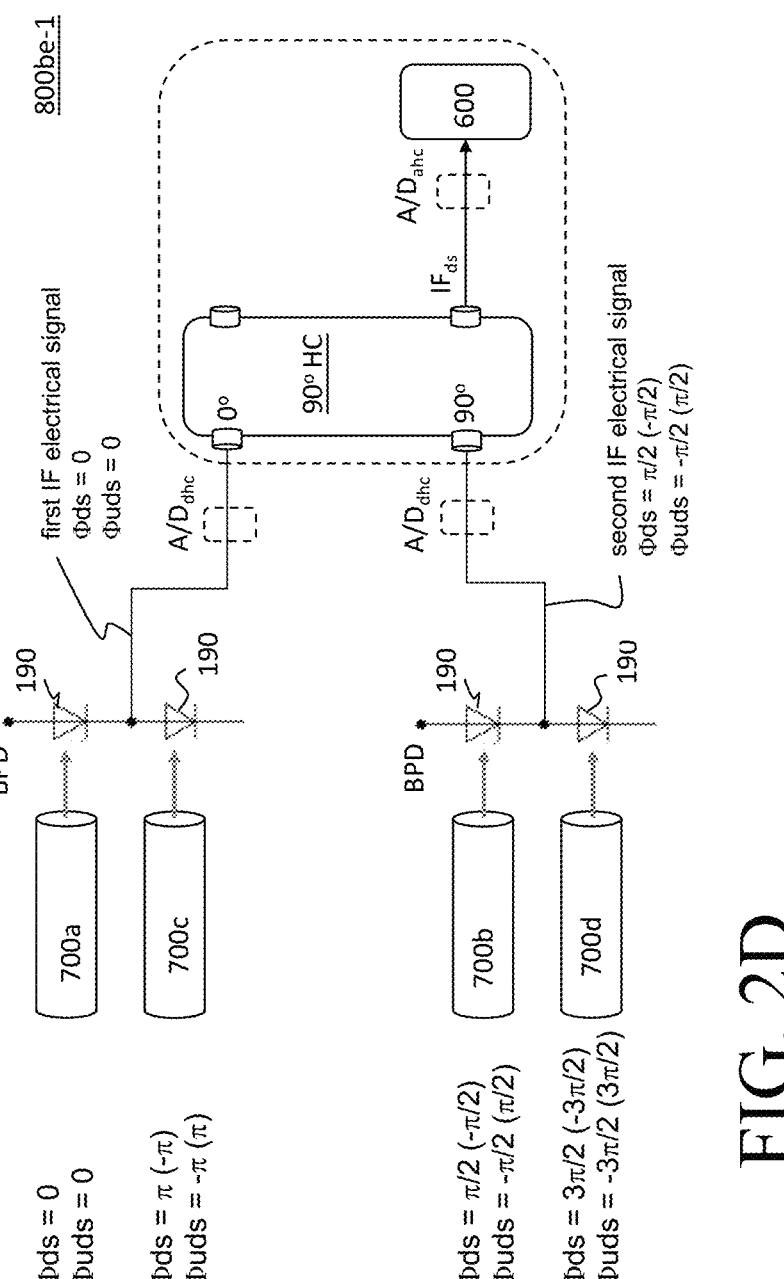
Figure 2E:
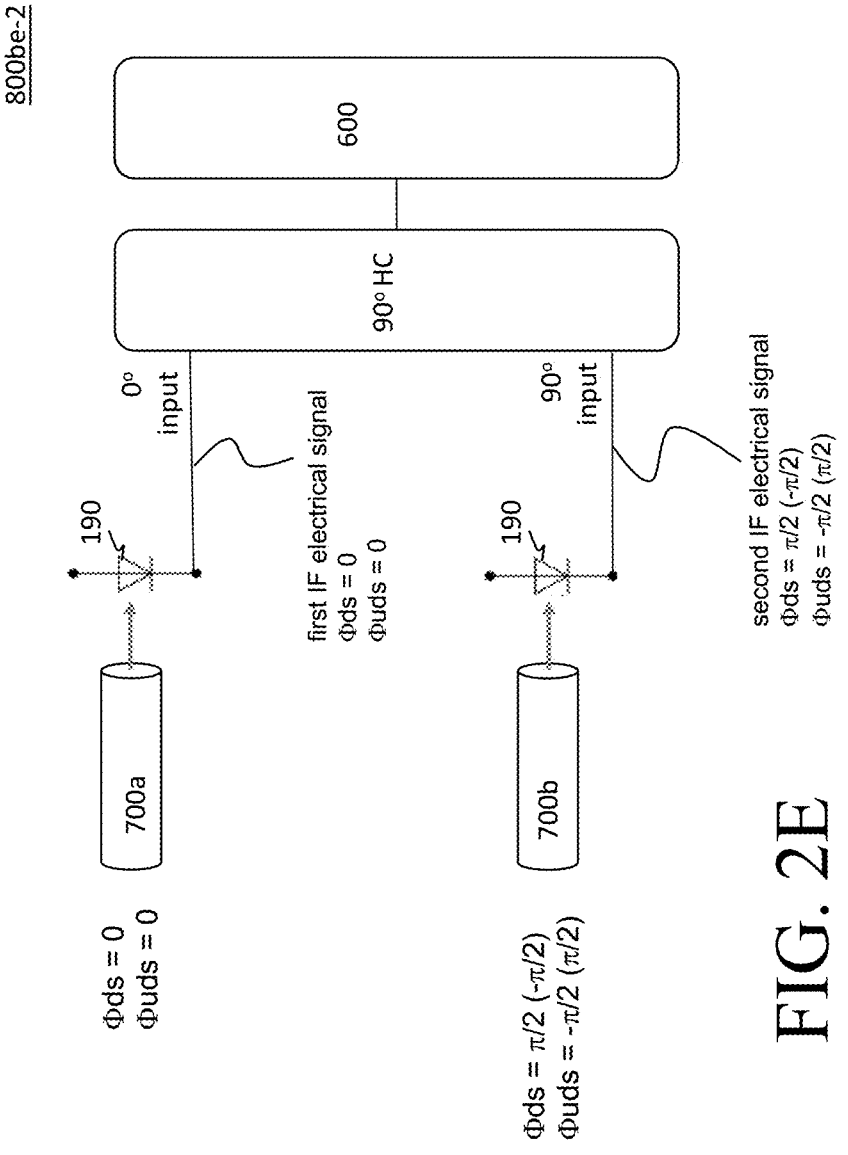

FIG. 2A illustrates exemplary operations of receiver 1000 comprising an image rejection mixer 800 in accordance with certain embodiments. FIG. 2B provides a series of spectral plots to illustrate exemplary signal processing that may be performed by receiver 1000 including an image rejection mixer 800 in accordance with the method of FIG. 2A. FIGS. 2C-2E illustrate exemplary structure of an image rejection mixer 800. FIG. 2C illustrates exemplary details of a frontend 800$_{fe}$ of image rejection mixer 800. FIGS. 2D and 2E illustrate exemplary details of a backend 800$_{be}$ of image rejection mixer 800, with FIG. 2D showing configurations implemented with balanced photodiodes and FIG. 2E showing a configuration 800$_{be-2}$ without the use of a balanced photodiode. It will be appreciated that portions of this signal processing description refer to processing of a single channel 20 or a single RF beam captured by the antenna array 110, but similar processing will be understood to (i) occur in all channels 20 (ii) as well as with respect to all captured RF beams.

In step S10, antennas 120 of antenna array 110 capture a first RF beam (e.g., transmitted from a RF source). The first RF beam may be received by the antenna array 110 with other RF signals, such as other RF beams from other RF sources and noise. For example, consider an example where receiver 1000 has an RF front end that captures 20 GHz of bandwidth spanning from 20 GHz to 40 GHz (e.g., using antennas having an operational bandwidth of 20 GHz to 40 GHz), and whose digitization bandwidth is 2 GHz. In such a system, assume that the signal of interest is received as the first RF beam having a carrier frequency of 25 GHz. Spectral plot (a) of FIG. 2B represents the captured first RF beam (desired signal) having an RF carrier frequency of 25 GHz. The first RF beam may be a spectrum of RF signals within a bandwidth that falls within the digitation bandwidth (e.g., that falls within an IF bandwidth of 2 GHz (corresponding to the digitation bandwidth) in this example) centered on the RF carrier frequency of 25 GHz. Additional RF signals within the 20 GHz to 40 GHz bandwidth of the receiver's frontend may also be received and converted with the first RF beam into electrical signals by the antennas 120. Such additional RF signals may be noise or other RF beams transmitted from other RF sources—at the same RF carrier frequency of the first RF beam (e.g., 25 GHz in this example) or at different RF carrier frequencies. A portion of such additional RF signals may correspond to the "undesired signal" described herein.

At step S12, the optical source (e.g., TOPS) generates the optical carrier (OC) signal (125) and the reference optical signal (187) as a local oscillator (LO), represented by spectral plot (b) of FIG. 2B. The optical carrier signal and the LO may be phased locked with each other and may differ by a set frequency offset that may be equal to the RF carrier frequency of the desired signal (the first RF beam)+/−an intermediate frequency "IF" (corresponding to a down-conversion performed in later steps). Although the frequency of the optical carrier signal (OC) is less than that of the LO in this example, the opposite relationship can also be implemented (in which case the later step of filtering extracts the lower sideband for continued downstream processing rather than the upper sideband in this example).

At step S14, each RF electrical signal generated by an antenna 120 modulates the optical carrier (OC) with a corresponding opto-electrical modulator 130 to obtain a modulated optical signal (at output 135) containing the optical carrier signal (OC) and sidebands imprinted with the RF electrical signal provided by the corresponding antenna 120 to which the modulator 130 is connected. The desired signal is thus converted into an upconverted optical signal (corresponding to the upconversion of the portion of the RF electrical signal provided by an antenna 120 resulting from capturing the first RF beam by the antenna 120) and is represented in spectral plot (c) of FIG. 2B as an arrow within each optical sidebands (each optical sideband having widths of 20 to 40 GHz) on either side of the optical carrier OC. Information contained by the first RF beam is preserved by each of these upconverted optical signals.

At step S22, one of the optical sidebands including one of the upconverted optical signals is extracted for further processing by filtering out the optical carrier and the other optical sideband. Spectral plot (d) of FIG. 2B illustrates the remaining sideband including the upconverted optical signal (represented by an arrow). It is noted that this extraction/filtering step S22 may occur any time after upconverting to generate the upconverted optical signal (e.g., any time after modulation of the optical carrier OC with the RF electrical signal) before the electrical signals are generated in step S24. For example, in the receiver 1000, a filter may be implemented in each of the channels 20 after electro-optical modulation (i.e., within the optical path of the fibers 40), within interference space 30 or after capture by the sensor array 700 (e.g., within the optical path of fibers 60). These options are represented in the method of FIG. 2A with the addition of dashed lines.

At step S16, an optical beam (185) is formed as described herein. The optical beam 185 may contain a desired signal corresponding to the first RF beam and an undesired signal (e.g., a portion of the optical sideband that may downconvert to the same IF frequency bandwidth as that of the desired signal and thus provide undesired noise or interference with the desired signal). The desired signal contains the information of the first RF beam (e.g., encoded information provided by the first RF beam). The optical beam (185) may be formed by transmitting each of the upconverted optical signals provided by fibers 40 into the interference space 30 at the channel edge 34 as described herein. Furthermore, when plural RF beams are captured by the antenna array 110, they may be spatially separated (e.g., spatially filtered from one another) at the beamspace edge 36. As described herein, the AoA of the first RF beam is represented by and can be extracted by the location of the optical beam 185 at the beamspace edge 36 (e.g., due to preservation of the corresponding phase offsets provided in the created RF electrical signals output by antennas 120 and upconverted optical signals (in outputs 135)).

At step S18, the LO is mixed (combined) with the optical beam 185. As noted herein, mixing the LO (reference optical signal 187) with the optical beam 185 may occur at various locations within the receiver 1000, (e.g., options (a), (b) and (c) for inserting optical signal 187 to combine with optical beam 185, as shown in FIG. 1B)). In spectral plot (e) of FIG. 2B shows a "blown-up" portion of the optical sideband of spectral plot (d), with the LO denoted as with the vertical arrow. The full optical sideband is not shown in spectral plot (e), but instead represented by the horizontal arrow labeled "$f_{oc}$+20 to 40 GHz" (the bandwidth in of the optical sideband in this example). The "desired signal" in spectral plot (e) has the same bandwidth as that of the first RF beam. As shown in spectral plot (e), the center frequency of the desired signal differs from the frequency of the LO by IF (1 GHz in this example). Also shown in spectral plot (e) is an "undesired signal" on the other side of the frequency of the LO, also having a center frequency that differs from the LO by IF. It should be appreciated that the relative locations of the desired signal and the undesired signal with respect to the LO may be switched. That is, the frequency of the LO may be set to be lower than the center frequency of the desired signal by IF (to down-convert the desired frequency to the IF frequency). In this instance, the undesired signal would correspond to the portion of the optical sideband centered at LO-IF (instead of LO+IF as in this example). In general, the undesired signal may correspond to the portion of the optical sideband centered at a frequency of LO+/−IF (depending on the relative location of the frequencies of the desired signal and the LO) having a bandwidth that corresponds to that of the desired signal.

Spectral plot (f) of FIG. 2B illustrates optical beat frequencies resulting from the mixing of the desired signal and the undesired signal with the LO (as represented in spectral plot (e)). Optical heterodyning occurs between the LO and the desired signal—the LO and the desired signal iteratively constructively and destructively interfere with each other at a frequency equal to the difference in frequencies between the LO and the desired signal. This beat frequency is represented optically, with the interference between the LO and the desired signal generating a resultant signal waveform whose envelope oscillates (increases and decreases in size) at the beat frequency. The resultant signal (which also may be referenced as a composite signal) is an optical signal and thus may be transmitted by optical fibers 60 or other optical waveguides. The beat frequency between the LO and the center frequency of the desired signal corresponds to the IF frequency (1 GHz in this example).

In the same manner, optical heterodyning may also occur between the LO and the undesired signal to generate a beat frequency (represented optically by the interference between the LO and undesired signal). Spectral plot (f) of FIG. 2B illustrates that both the desired signal and undesired signal create "down-converted" beat frequencies that overlap centered about the IF frequency (1 GHz in this example). It should be appreciated that the beat frequencies are formed optically with the composite optical signals represented in spectral plot (e). Thus, while the "down-converted" beat frequencies at this stage are non-optical frequencies (e.g., are at RF frequencies), the down-conversion at this stage need not result in an electrical down-converted signal.

The overlap of the "down-converted" beat frequencies occurs due to the mixing of the LO with a signal creating two beat frequency sideband signals (one at the frequency of the LO+the frequency of that signal and another at the frequency of the LO−the frequency of that signal). In this example, the frequency of the desired signal is centered on $f_{oc}$+25 GHz, the frequency of the undesired signal is centered on $f_{oc}$+27 GHz and the frequency of the LO is $f_{oc}$+27 GHz. Thus, mixing the LO with both the desired and undesired signal produce two combined composite optical signals having "down-converted" beat frequencies centered at the same IF frequency of 1 GHz. It should be appreciated that different RF carrier frequencies may be downconverted to the IF frequency by setting the frequency difference between OC and the LO (i.e., setting the frequency difference of the optical signals 125 and 187). The IF frequency and IF bandwidth may respectively correspond to a digitation bandwidth of the RF spectrum (separating different RF carrier frequencies) and RF frequency bandwidths (centered on an RF carrier frequency) of the RF beams, which may be chosen by a system designer. With this in mind, the undesired signal may be understood to simply correspond to undesired RF frequencies obtained by the antennas 120, which when processed along with the first RF beam, correspond to the undesired "down-converted" beat frequency centered on the IF frequency in the bandwidth of interest (i.e., in the bandwidth of the first RF beam centered on the IF frequency).

In step S18, the LO is mixed (combined) with the optical beam 185 at a plurality of pickups 700a, 700b, 700c and 700d located at different optical path lengths from one or both of the LO source 187a and optical beam source 185a. FIG. 2C is a simplified representation of the combining of the optical beam 185 and the LO using optical paths (represented as arrows traversing an interference space (FTS) of different optical path lengths. FIG. 2C illustrates LO transmitted via optical paths of different path lengths to pickups

700a, 700b, 700c and 700d from the LO source 187a, and optical beam 185 is transmitted via optical paths of different path lengths to pickups 700a, 700b, 700c and 700d from the optical beam source 185a. Alternatively, some or all of the optical paths from the LO (187) to the pickups 700a-d may have equal optical path lengths and/or some or all of the optical path from the optical beam (185) to the pickups 700a-d may have equal optical path lengths. The optical path length equals the index of refraction of the transmission medium multiplied by the physical path length. Thus, when the transmission medium of these optical paths is the same throughout (e.g., air, vacuum, glass, etc.), the actual path lengths of all the optical paths are the same fraction of the corresponding optical path lengths (or the same, in the case of a vacuum as the transmission medium).

As shown in FIG. 2C, spacing din between optical beam source 185a and LO source 187a (along the FTS input surface) is matched to spacing $d_{out}$ between each pair of adjacent pickups 700 a-d (along the FTS output surface). This matched spacing may be implemented with an equal spacing or a 3× spacing (the separation din between 185a and 187a is the same as the spacing $d_{out}$ or $3 \times d_{out}$). The matched spacing may conform to the relationship of din modulo 4=1 in units of the pickup separation $d_{out}$ (when magnification of the IRM lens (provided by the FTS) is 1). The relationship between spacing between 185a and 187a din at the input FTS surface and the pitch $d_{out}$ of the spacing between pickups 700a-d at the FTS output surface may conform to:

$$N * d_{in} * d_{out} = \text{lambda} * f \qquad \text{(eq1)}$$

where N is 4 (corresponding to the number of pickups) elements in the DFT (4 in the IRM), lambda is the optical wavelength (e.g., ~1550 nm), and f is the focal length of the IRM lens (focal length of the lens provided by the FTS).

When the FTS lens (the IRM frontend 800$_{fe}$) is implemented with a star coupler (as discussed herein), the radius of curvature R of the FTS input surface and the FTS output surface radius may represent the focal length f of the FTS lens, and din and $d_{out}$ may have the following relationship:

$$\sin(N * d_{in}/(2 * R)) = \text{lambda}/(2 * d_{out}). \qquad \text{(eq2)}$$

When the FTS lens (the IRM frontend 800$_{fe}$) is implemented with a 4×4 star coupler the input optical beam 185 and the LO (187) should be in adjacent input ports, with periodic boundary conditions (e.g., ports 1&2, 2&3, 3&4, or 4&1, where the ports are sequentially numbered in their positional order). These periodic conditions may be implemented in IRM frontends 800$fe$ other than those using a star coupler.

The different optical path lengths generate IF beat signals having different phase offsets at the pickups 700a-700d. Specifically, the desired signal may be represented in a "down-converted" beat frequency at quadrature phase increments (e.g., relative phase shifts of 0, 90, 180 and 270 degrees respectively at pickups 700a, 700b, 700c and 700d, or alternatively, relative phase shifts of 0, −90, −180 and −270 degrees respectively at pickups 700a, 700b, 700c and 700d). The undesired signal may also be represented in a "down-converted" beat frequency at quadrature phase increments, but in a phase shift (phase incrementing) direction opposite to that of the "down-converted" beat frequency of the desired signal. Thus, if the relative phase shifts of the "down-converted" beat frequency of the desired signal is 0, 90, 180 and 270 degrees respectively at pickups 700a, 700b, 700c and 700d, the relative phase shifts of the "down-converted" beat frequency of the undesired signal may be 0, −90, −180 and −270.

FIG. 2C illustrates structure of a frontend 800$_{fe-1}$ of the image rejection mixer. The portion of frontend 800$_{fe-1}$ surrounded by a dashed line box and identified as 800$_{fe-2}$ represents an optional implementation of the image rejection mixer front end (implemented with only two optical pickups). In FIG. 2C, the optical beam 185 and the LO beam (reference signal 187) may be contiguously formed and mixed in an interference space interposed between the optical beam source 185a and the LO source 187a. This interference space may allow the optical beams transmitted therethrough (e.g., optical beam 185, the LO beam, or component beams forming the optical beam 185 and/or LO beam) to interfere with one another. The interference space may be a Fourier transform space (FTS) to provide a transformation of the representation of information provided by one or more inputs (at the FTS input surface) to its one or more outputs (at the FTS output surface). For example, AoA directional information of the first RF beam provided by the wavefront of the optical beam 185 at the FTS input surface may be transformed to a spatial location at the FTS output surface. The interference space (FTS) may be defined between its FTS input surface and its FTS output surface. In the FTS represented in FIG. 2C, the optical beam source 185a and the LO source 187a are inputs into the interference space (FTS) and pickups 700a-d are outputs of the interference space (FTS). The FTS may be the same as interference space 30 or may be formed elsewhere in the optical processor 10 of the receiver 1000 (e.g., as described below in more detail).

The interference space FTS of the frontend 800$fe$ may include optics, such as one or more discrete lenses or act as a lens, and thus is referenced herein as a IRM lens herein. It should be noted that use of "lens" in this application contemplates a lens that may be formed by combining several discrete lenses (where each such discrete lens may be contiguously formed). In some examples of the receiver 1000, both the object plane (e.g., FTS input surface) and image plane (e.g., FTS output surface) of the IRM lens are populated with optical fiber arrays, hence both planes may be discretely sampled. When both the object and image planes of the IRM lens are thus populated with identical arrays, the Fourier transform operation of the IRM lens (and frontend 800$fe$) becomes a discrete Fourier transform (DFT), and may be represented as a matrix that relates the optical signals in the input fibers to those in the output fibers. It should be appreciated that the object plane, image plane and focal plane of a lens need not be geometrically planar, and the terms "object surface," "image surface," and "focal surface" may be used to emphasize this broader concept. The input and output fiber signals can be represented as complex-valued vectors indexed by the enumeration of the fibers. For imagers, the signal amplitudes are typically equal, hence the complex values reduce to phase factors. Note that the weights of the elements in a phased array receiver may also be varied, e.g., for sidelobe suppression, and this would be manifested as variable magnitudes across the array elements. Now consider a one-dimensional array. When the fiber sampling interval d is properly matched to the imaging system (the preferred relation is $Nd^2=\lambda f$, where N is the number of array elements, $\lambda$ is the wavelength, and f is the focal length of the IRM lens), the elements of the DFT matrix are given by $$F_{mn} = \exp(mn[i2\pi/N]). \qquad (eq3)$$

Examination of this matrix reveals that, for certain combinations of m, n, and N, the sampled outputs from a 1D imaging receiver may be phase offset in increments of 90 degrees ($\pi/2$ radians), also termed "quadrature" increments (since 90 degrees is one quarter of a full cycle). This means that for a pair of input fibers, the IRM lens can function to extract the IF frequency with phase offsets in quadrature increments.

Note that while the optical beam 185 and the LO beam illustrated in FIG. 2C are shown to be expanding in width with respect to the transmission direction, different beam formations may be implemented, such as narrowing in width (e.g., focused) or constant width with respect to the transmission direction (for one or both of the optical beam 185 and the LO beam). Optics, such as one or more of lenses, reflectors, splitters, and/or combiners may be used along these optical paths (e.g., positioned in the interference space (FTS)) to guide the optical beam 185 and LO beam to the different pickups 700a-d or used for other purposes. In addition, the optical beam source 185a and the LO beam source 187a may emit the optical beam 185 and LO from a single contiguous location (e.g., by a single waveguide and/or lenslet as represented in FIG. 2C). Alternatively, one or both of the optical beam source 185a and the LO beam source 187a may emit the optical beam 185 and LO from several separated discrete locations (e.g., from several waveguides and/or lenslets at the FTS input surface). The upper left portion of FIG. 2C illustrates this option, where plural fibers may be implemented for optical beam source 185a in place of the single fiber. The plural fibers terminate at the FTS input surface and be arranged in a direction perpendicular to the plane in which the centers of the inputs and outputs are arranged (in this example, arranged in the z direction, perpendicular to the (x,y) plane in which centers of inputs 185a, 187a and centers of outputs 700a-d are arranged).

Alternatively, optical beam 185 and the LO beam (reference signal 187) may be split and travel as separate discrete beams along the optical paths to the pickups 700a-d. For example, optical beam 185 and the LO beam may be split and transmitted by corresponding optical waveguides, such as optical fibers.

In step S20, the LO combined with the optical beam 185 (containing the desired signal and the undesired signal) is captured at each pickup 700a-d. Each pickup 700a-d may be or may have the same structure as an input of the sensor array 700 (e.g., comprise a lenslet coupled with an optical fiber (or other optical waveguide), a photodetector or a lenslet coupled with a photodetector). In this example, the pickups are each a lenslet/optical waveguide pair and capture a portion of the optical beam 185 (combined with a portion of the LO beam) and transmit the same along the optical waveguide.

As noted, the desired signal may be represented optically by the "down-converted" beat frequency at quadrature increments in one phase shift direction (e.g., positive or negative), while the undesired signal may result in an optical signal having a "down-converted" beat frequency at quadrature increments in the other phase shift direction (e.g., negative or positive). FIG. 2C denotes the exemplary relative phase shifts introduced at each of the pickups 700a-d as $\Phi$ds (for the desired signal—the desired "down-converted" beat frequency signal) and $\Phi$uds (for the undesired signal—the undesired "down-converted" beat frequency signal), with alternative exemplary relative phase shifts being shown in parentheses. It should be appreciated that the optical signals captured by each pickup location 700a-700d may have the same frequency and include the same "down-converted" beat frequencies resulting from (i) the interference of the LO and the desired signal and (ii) the interference of the LO and the undesired signal, but have different phase shifts introduced as described herein.

In step S24, the portions of the optical beams captured by the different pickups 700a-700d are transmitted to a backend 800$_{be}$ of the image rejection mixer 800 to be converted into at least two IF electrical signals. All four optical signals captured by pickups 700a-700d may be fed to a pair of balanced photodetectors (BPDs). FIG. 2D illustrates a IRM backend 800$_{be-1}$ implemented with two BPDs. Each of the two BPDs comprise two identical photodetectors 190 that are serially connected to output the difference between the output photocurrents from the individual photodetectors 190, such that when fed by signals offset in phase by x, but otherwise identical, common-mode rejection (CMR) is obtained, enhancing signal response and suppressing noise. Each BPD may receive two of the four optical signals captured by the pickups 700a-700d that are offset in IF by 180 degrees (x). In FIG. 2D, one BPD has its two photodetectors 190 respectively optically coupled to the optical signals captured by pickup 700a and 700c to obtain output a first IF electrical signal, and the other BPD has its two photodetectors 190 respectively optically coupled to the optical signals capture by pickups 700b and 700d to obtain a second IF electrical signal. The first and second IF electrical signals are output by the corresponding BPD at the node connecting the two photodetectors 190 of the BPD. Optionally, first and second IF electrical signals may be amplified at this stage (e.g., by an amplifier (not shown), such as a transimpedance amplifier).

The first and second IF signals are electrical signals centered on the IF frequency (1 GHz in this example), and offset in phase from one another by 90 degrees. Note that phase notation of the first and second IF electrical signals in FIG. 2D include alternative phase shift directions corresponding to the alternative phase shift directions discussed herein with respect to the optical beat frequencies of the desired signal and undesired signal. However, the noted phase shifts of the first and second IF electrical signals are relative to each other and may be shifted with respect to the phases of the optical signal beat frequencies of the pickups 700a-d noted in FIG. 2D.

FIG. 2E illustrates an alternative implementation 800$_{be-1}$ of the backend of the IMR that may be formed with frontend 800$_{fe-2}$ of FIG. 2C. The first and second IF electrical signals may be obtained by applying only two optical signals captured by two pickups (that are 0 and 90 degree phase offset from each other) to two photodetectors 190. In this implementation, only two of the pickups (e.g., 700a and 700b) need be implemented (and additional pickups 700c and 700d may be avoided). In this implementation, the optical signals captured by pickups 700a and 700b are directed onto a corresponding photodetector 190 which respectively generate the first and second IF electrical signals (having IF frequencies and phase offsets corresponding to the optical beat frequency of the desired and undesired signals). The 90 degree hybrid coupler of FIG. 2F may be either an analog 90 degree hybrid coupler or a digital 90 degree hybrid coupler (e.g., as discussed herein) and thus A/D converter(s) (not shown in FIG. 2E) for digital conversion of the appropriate IF electrical signal(s) (e.g., as shown in FIG. 2D) may be provided before or after the 90 degree hybrid coupler.

In each implementation, the single photodetectors and balanced photodetectors both generate first and second IF electrical signals. Each of the two IF electrical signals correspond to a combination of the two optical "down-converted" beat frequency signals of the desired signal and undesired signal. Specifically, each of the first and second IF electrical signals are a composite signal having a first component signal corresponding to (i) the beat frequency signal resulting from the combination of the LO and the desired signal in the optical beam 185 (i.e., the desired "down-converted" beat frequency signal) and a second component signal corresponding to (ii) the combination of the LO and the undesired signal in the optical beam 185 (i.e., the undesired "down-converted" beat frequency signal). Thus, each of the first and second IF electrical signals electrical signals centered at the IF frequency (1 GHz in this example), providing an electrical signal version of both beat frequency signals of spectral plot (f) of FIG. 2B. Thus, each of the two IF electrical signals may contain information of the desired signal (corresponding to that of the first RF beam) as well as noise of the undesired signal at the same frequency bandwidth.

Based on only one of the IF electrical signals generated in step S22, it may not be possible to determine which components of that IF electrical signal represent the desired signal and which components represent the undesired signal. However, the component signals of the two IF electrical signals differ in phase by 90 degrees, and this may be utilized to extract the desired signal while suppressing the undesired signal.

In step S24, the two IF electrical signals may be processed by a 90 degree hybrid coupler to extract the desired signal and suppress the undesired signal. The 90 degree hybrid coupler may be an analog 90 degree hybrid coupler and the first and second IF electrical signals may be input to the 0 degree and 90 degree input ports of the 90 degree hybrid coupler. Which of the first and second IF electrical signals is input into the 0 degree port and which is input into the 90 degree input port may depend on the relative phase shift direction of the first and second IF electrical signals. Specifically, if the 90 degree hybrid coupler shifts the second IF electrical signal input into 90 degree input port in phase by $-\pi/2$ ($-90$ degrees) and combines the shifted second IF electrical signal with the first IF electrical signal, the output IF electrical signal output by the 90 degree hybrid coupler comprises the desired signal component (resulting from constructive interference between the two desired signal components of the first and second electrical signals (now at a zero phase offset)) and suppression of the undesired signal component (resulting from destructive interference between the two undesired signal components of the first and second electrical signals (now at $\pi$ (180 degree offset)). However, if the 90 degree hybrid coupler shifts the second IF electrical signal input into 90 degree input port in phase by $+x/2$ ($+90$ degrees) or the direction of the phase offsets of the desired signal component and the undesired signal component are reversed, the first and second IF electrical signals inputs to the 90 degree hybrid coupler should be reversed (to that shown in FIG. 2D).

The 90 degree hybrid coupler may also be implemented by a digital 90 degree hybrid coupler (e.g., implemented by a DSP, a computer, an FPGA) that performs the cancellation/suppression of the undesired signal component provided in the first and second IF electrical signals to extract the desired signal component. As shown in FIG. 2D, the first and second IF electrical signals may be converted to digital signals by A/D converters A/D$_{dhc}$ provided at the outputs of the BPDs and the first and second IF signals may be provided in digitized form to the to the digital 90 degree hybrid coupler.

The output of the 90 degree hybrid coupler (whether an analog or digital 90 degree hybrid coupler) may then be provided to processor 600. When implemented with an analog 90 degree hybrid coupler, the output of the analog 90 degree hybrid coupler may be digitized by the optional A/D converter A/D$_{ahc}$ shown between the 90 degree hybrid coupler and the processor 600. The A/D converter A/D$_{ahc}$ is unnecessary when the IRM is implemented with a digital 90 degree hybrid coupler, and the A/D converters A/D$_{dhc}$ are unnecessary when the IRM is implemented with an analog 90 degree hybrid coupler.

It should be noted that the digital hybrid coupler may be implemented with the same hardware constituting processor 600 which is represented by the dashed line in FIG. 2E. For example, the digital hybrid coupler may be a processor 600 configured by a software module to perform the extraction of the desired signal component, and/or may be hardware module of a system on a chip (SoC) constituting the processor 600.

Figure 3:
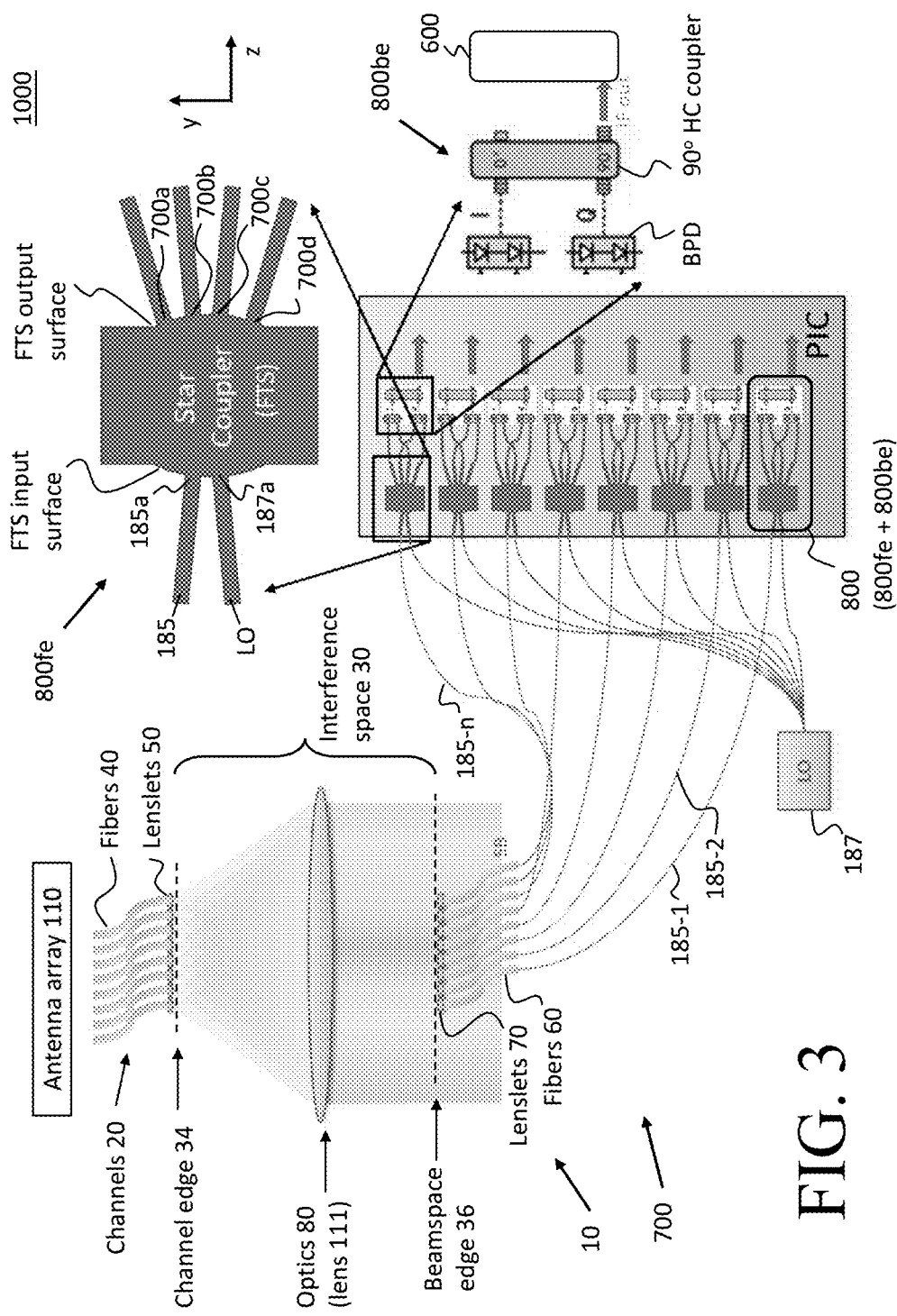
FIG. 3 illustrates receiver 1000 formed with IRMs 800 according to embodiments of the present invention.

FIG. 3 illustrates receiver 1000 formed with IRMs 800 according to embodiments of the present invention. As will be appreciated, several IRMs 800 are formed as part of sensor array 700, being formed in each sensor between the beamspace edge 36 and the IF output to processor 600. Specifically, as discussed herein, antenna array 10 may capture several RF beams transmitted to the receiver 1000, which are then transformed to spatially separated optical beams 185 and captured at beamspace edge 36 by sensor array 700. The antenna array 110 and optical processor 10 through this part of the signal processing may correspond to any of the embodiments described herein (e.g., with respect to FIGS. 1A to 1E). The channel arrangement of channels 20 at channel edge 34 may correspond to that of the antennas 120 (as in FIG. 1C) or the channel arrangement at channel edge 34 may be linear array (formed along a single straight or curved line) as described herein.

It will be apparent that FIG. 3 adopts option (c) depicted in FIG. 1B for the insertion of reference beam 187 (LO) after capture of the optical beams 185 by sensor array 700. Each sensor in this example may be formed of a lenslet/fiber pair (70/60) (to capture and transmit a corresponding optical beam 185-$n$) and an IRM 800 (note that the photodetectors 190 of the IRMs 800 correspond to the photodetectors 190 referenced with respect to the description of FIGS. 1A-1E). Although FIG. 3 illustrates details of an IRM 800 corresponding to IRM frontend 800$fe$-1 and IRM backend 800$be$-1, IRM 800 may be formed of any pair of the IRM frontends 800$fe$ and IRM backends 800$be$ that have been described herein (or any version of the IRM 800 described herein).

FIG. 3 illustrates the interference space of the IRM 800 (depicted as Fourier transfer space (FTS)) being formed by a star coupler having inputs of an optical beam 185 and the LO (reference signal 187). The star coupler (FTS), the photodetectors (BPDs or single photodetectors), and 90 degree coupler for all of the sensors of sensor array 700 may be formed on the same chip (e.g., PIC) as depicted in FIG. 3. In addition, additional portions of the receiver 1000 (such as all or some of the optical processor 10 upstream of the IRM 800) may also be formed on the same chip (PIC), including the interference space 30 and its inputs and outputs. Detailed description of structure and operation of the receiver 1000, including IRM 800 has been set forth elsewhere herein and need not be repeated here.

Figure 4A:
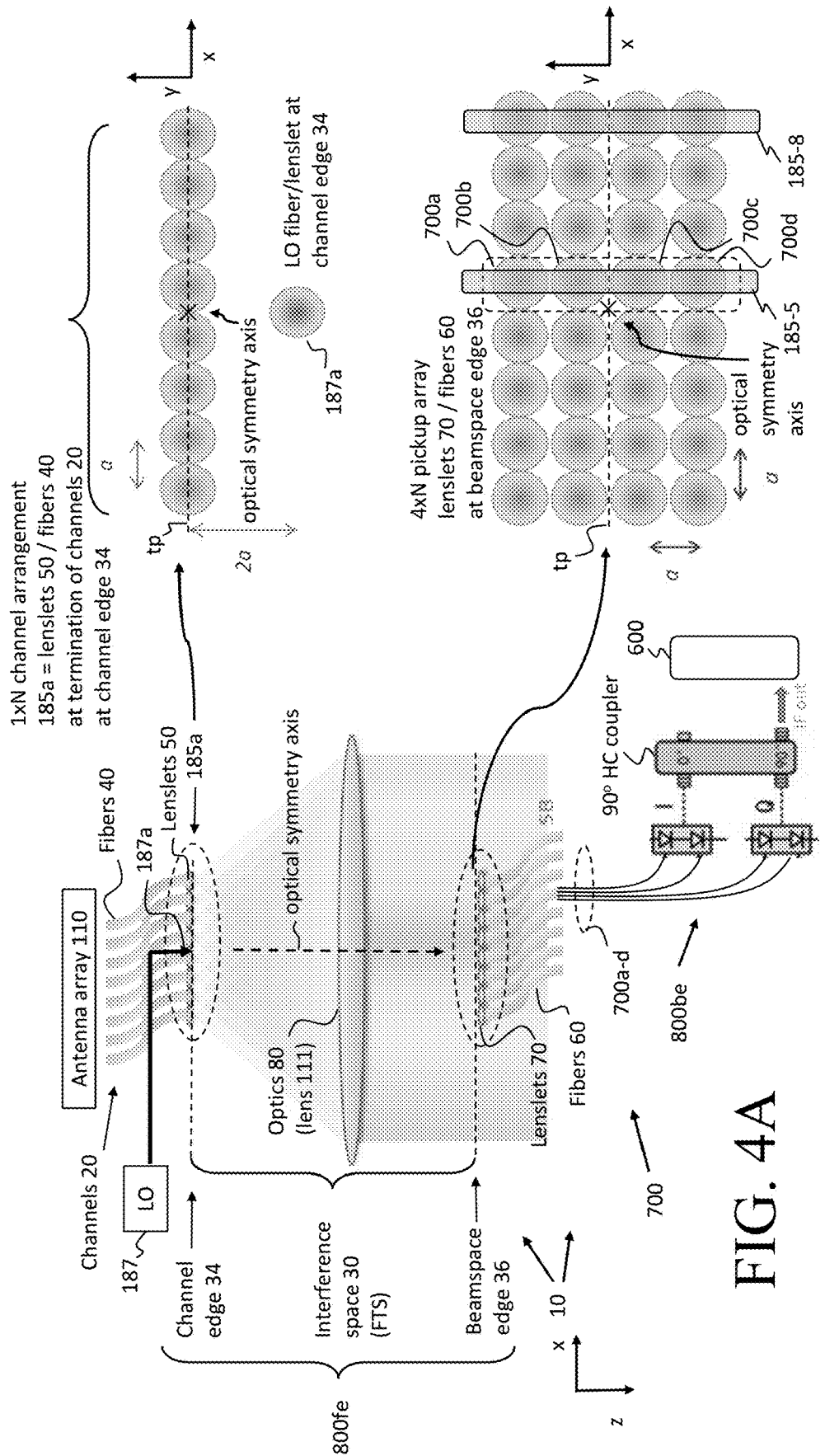
FIG. 4A illustrates receiver 1000 formed with IRMs 800 according to embodiments of the present invention.

FIG. 4A illustrates receiver 1000 formed with IRMs 800 according to embodiments of the present invention. In these embodiments, the interference space of the IRM (depicted as Fourier transfer space (FTS)) may be the same as the interference space 30 of the optical processor. The frontend of the IRM 800fe is corresponds to the lenslet/fiber pairs (50/40) at the channel edge 34 (constituting optical beam source 185), the LO source 187a at the channel edge 34, the interference space 30 (constituting the FTS), and lenslet/fiber pairs (70/60) at the beamspace edge 36 (constituting a 2×N or 4×N pickup array, forming multiple (N) sets of pickups 700a-d). This implementation corresponds to option (a) for the insertion of the reference beam 187 (LO) in FIG. 1B.

In the cartesian coordinates of FIG. 4A, the optical symmetry axis of in the interference space 30 (FTS) (corresponding to the optical axis of the lens of the interference space 30) extends in the z direction (downward on the left side of FIG. 4A, and in an out of the paper for the right side views of FIG. 4A). The upper right portion of FIG. 4A is a view along the symmetrical axis (a cross sectional view of the left portion of FIG. 4A along the channel edge 34). As shown in this view, the channel arrangement at the channel edge 34 constitutes a 1D array of the channels 20 (each channel 20 terminating at a corresponding lenslet/fiber pair (50/40)) extending in the x direction and centered on the optical symmetry axis. The upconverted optical signals output by the lenslets/fibers (50/40) at the channel edge 34 form at least one beam 185 in the interference space 30 and thus correspond to optical beam source 185a described with respect to FIG. 2C. As described herein, each beam 185 formed in the interference space 30 (FTS) is spatially separated from one another at the beamspace edge 36. The lower right portion of FIG. 4A shows two beams 185-5 and 185-8 spatially separated at the beamspace edge 36 imping-ing a corresponding set of pickups 700a-700d. Similar formation of other beams 185 in the interference space 30 would form similar, spatially separate beams (e.g., 185-1, 185-2, . . . 185-8) on the corresponding on of the N sets of pickups 700a-700d.

As shown in FIG. 4A, the LO is also input into the interference space 30 (FTS) at the channel edge 34 and forms the LO source 187a described with respect to FIG. 2C. The upper right portion of FIG. 4 shows that the LO source 187a is offset from the linear arranged channels 20 in the y direction (perpendicular to the plane of the paper in the left portion of FIG. 4A). In this example, the LO is offset in the y direction from the line of channels 20 by twice (2a) the pitch (a) of the fibers 40. The unused dimension of the 2D Fourier transform lens may be used to obtain IF outputs with quadrature phases. Specifically, the LO source 187a is positioned at a point along the y direction, transverse to the arrangement of channels 20 (in the x direction) at the channel edge 34. The LO source 187a is above or below the tangential plane tp (corresponding to the (x,y) plane containing optical symmetry axis (which may correspond to the optical axis of the lens of the interference space 30)). The tangential plane tp contains the channel outputs provided by the 1D arranged lenslet/fiber pairs (50/40). Tangential refers to the plane containing the optical symmetry axis and an object not on the axis. The optical symmetry axis may be centered on the 1D channel arrangement of FIG. 4A with the fiber outputs displaced from the optical symmetry axis along the imaging direction, and all reside in a common tangential plane tp.

The optical processor 10 is configured to produce N beams on a 1D beam grid at the beamspace edge 36 (e.g., beams 185 spaced apart in the x direction of the linear arrangement of the channels 20 at the channel edge 34). By providing the LO source 187a at a location offset from the linear arrangement of the channels 20, the IF signal (optical beat signal at the IF frequency) produces an IF phase offset in the y direction, transverse to the spacing of the beams 185 (in the x direction) (see lower right view of FIG. 4A). Replacing the 1×N pickup array at the beamspace edge 36 with a 2×N or 4×N pickup array enables each beam's IF output to be sampled at quadrature increments. The lower right portion of FIG. 4A illustrates this concept with N=8 as an example, showing a 4×N pickup array. Each set of 4 pickups (700a-d) (each set arranged in the y direction) is positioned to capture one of the spatially separated beams 185 at the beamspace edge 36, allowing the IF output to be sampled at quadrature increments (at phase increments of $\pi/2$ at adjacent positions in the y direction.

Furthermore, if the horizontal spacing between adjacent channel outputs is "a" at the channel edge 34 and the LO is vertically offset by "2a" from the line of channel outputs (e.g., from the tangential plane), the pickups 700a-700d at the pickup array may be spaced apart from one another by a spacing of "a" in both the x direction and y direction (in the plane perpendicular to the optical symmetry axis at the beamspace edge 36). Thus, implementing the pickup array (2×N or 4×N) may be done using the same structure (e.g., same type of optical fibers or optical waveguides) with the same spacing. Thus, both the channel fibers 40 and pickup array fibers 60 may be stacked on one another—e.g., positioned side-by-side and in contact with neighboring fibers so that the width of the fibers themselves can be used to provide the same spacing (same pitch) of the fibers 40 (forming the linear channel arrangement at the channel edge 34) and fibers 60 (forming the pickup array at the beamspace edge 36) at the input and output of the interference space 30.

As described, each beam 185 is captured by 2 or 4 pickups of the pickup array. FIG. 4A provides an example of a 4×N pickup array (shown in lower right of FIG. 4A) where N=8. FIG. 4C illustrates a single 1D beam 185-5 formed at the fifth column of the 4×8 array as an elongated optical spot extending over four pickups (700a-700d in FIG. 4A and FIG. 2C) and having quadrature phase offsets with respect to the IF signal as discussed herein. FIG. 4C (a) shows the elongated optical spot without combining with the LO, FIG. 4B(b) illustrates the LO alone, while FIG. 4C (c) and FIG. 4C (d) illustrates the combination of the optical beam 185 with the LO and the resulting phase offsets produced formed across the four pickups The left portion of the illustration of FIG. 4A shows pickups 700a-700d associated with one of the beams being provided to backend of the IRM 800be. Only one backend of the IRM 800fe is shown in FIG. 4A, however, multiple IRM backends 800be are provided for each of the beams 185. The IRM backends 800be may be implemented with any of the embodiments described herein (e.g. as 800be-1 or 800be-1 of FIGS. 2D and 2E). When implemented with IRM backend 800be-2, a 2×N pickup array may be implemented (and the IRM frontend may correspond to 800fe-2 of FIG. 2C). Detailed description of structure and operation of the receiver 1000, including IRM 800 has been set forth else-where herein and need not be repeated here.

Figure 4B:
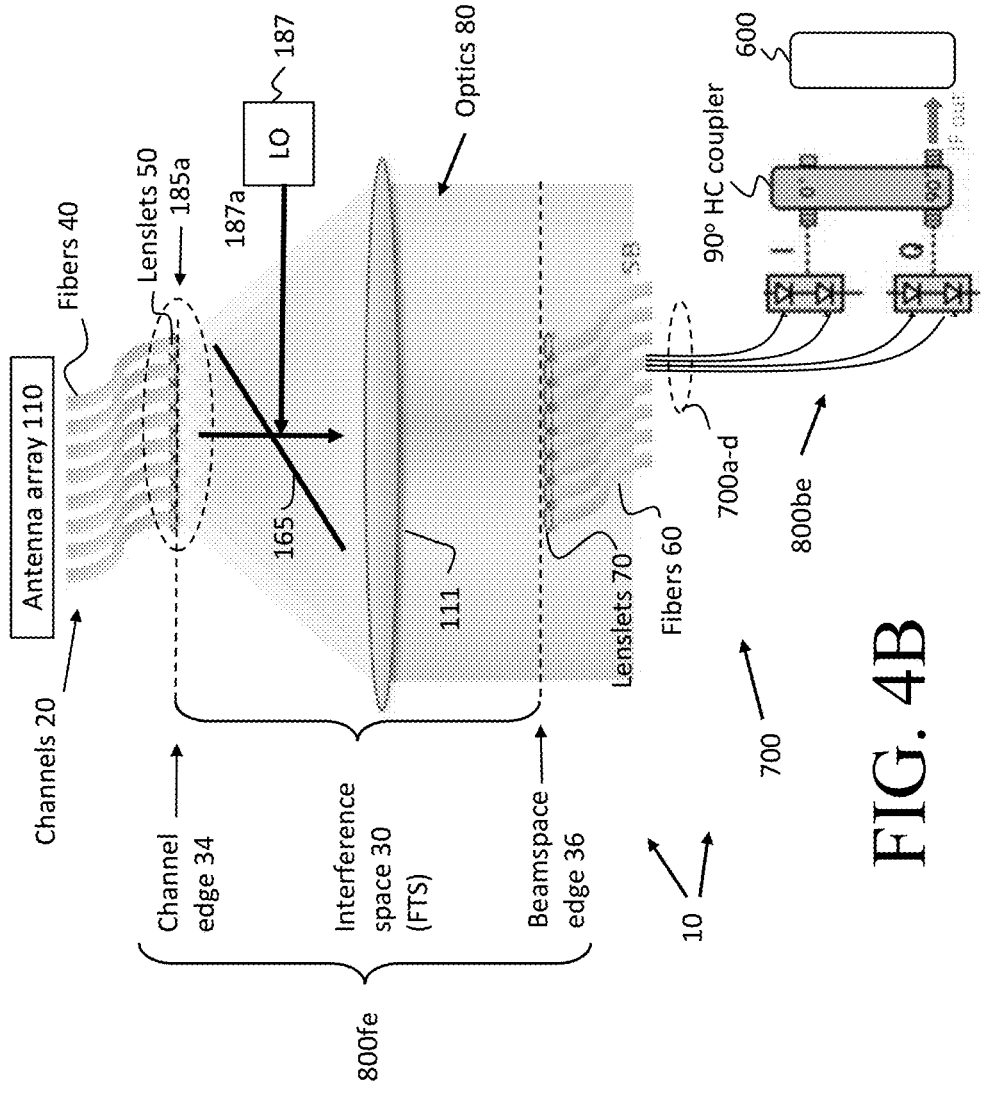
FIG. 4B illustrates an alternative implementation of mixing the LO with the optical beams.
Figure 4C:
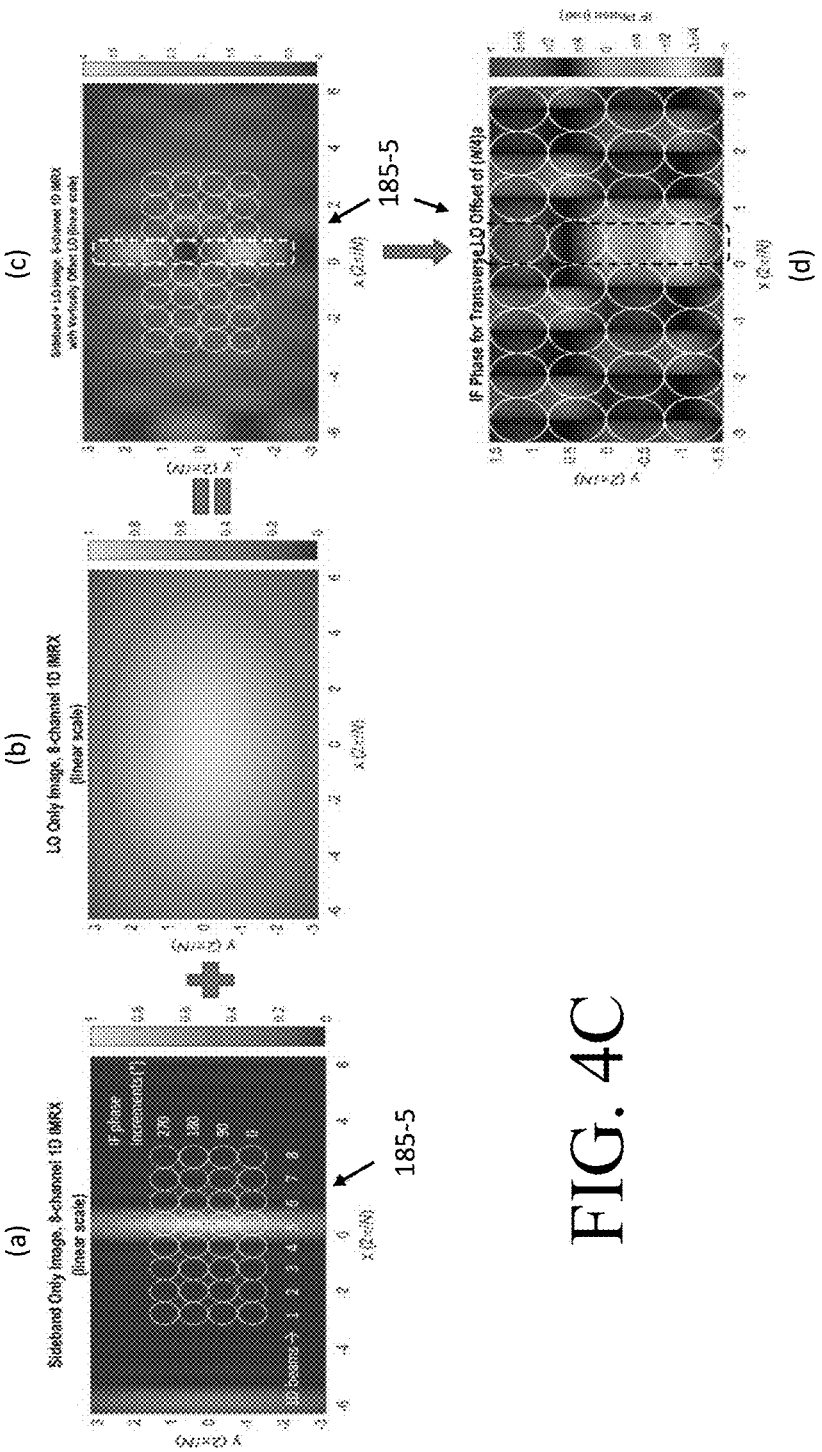
FIG. 4C illustrates a single 1D beam formed extending over four pickups.

FIG. 4B illustrates an alternative implementation of mixing the LO (reference beam 187) with the optical beams 185. Rather than insert the LO (187) at the channel edge 36 with the upconverted optical signals provided by channels 20, the LO (187) may be transmitted into the interference space 30 (FTS) at the side of the interference space 30 (FTS). An optical combiner 165 in the interference space 30 (FTS) may combine the optical beams 185 provided channels 20 that are formed in the interference space 30. The optical combiner 165 and lens 111 are simplistically represented in FIG. 4B and may have other configurations and positioning to accommodate the IRM operation and structure as described herein. The LO may be optically and physically offset from the linear arrangement of the channels 20 in a manner corresponding to that described with respect to FIG. 4A such that after combining with the optical beams 185, the same relative positions between the LO beam and the optical beams 185 are provided in the interference space 30 (FTS). For example the LO optical fiber 187 may be offset 2a in a direction above or below the plane of the paper of FIG. 4B when provided at the same optical distance from the beamspace edge 36 as that resulting from the configuration of FIG. 4A. The remaining structure and operation of FIG. 4B may be the same as described with respect to FIGS. 4A and 4C, and thus need not be repeated here.

The invention claimed is:

1. A receiver comprising:

an antenna array comprising a plurality of antennas configured to capture a first RF beam;

a plurality of channels each configured to communicatively couple a corresponding antenna of the antenna array to an interference space, each channel comprising:

an electro-optic modulator to modulate an RF electrical signal provided by the corresponding antenna with an optical carrier signal to generate a corresponding modulated optical signal including the optical carrier signal and two sidebands that constitute a first upconverted optical signal and a second upconverted optical signal, respectively, and a first optical waveguide configured to convey the first upconverted optical signal to the interference space;

the interference space, configured to receive the upconverted optical signals provided by the plurality of channels at a channel edge of the interference space to allow the upconverted optical signals to interfere with each other and form a first optical beam corresponding to the first RF beam at a beamspace edge of the interference space;

a plurality of sensors arranged at the beamspace edge to capture an interference pattern at the beamspace edge including the first optical beam, the plurality of sensors including a first sensor comprising an image rejection mixer, wherein the image rejection mixer comprises a Fourier transform space (FTS), a first optical beam source to receive the first optical beam and transmit the same into the FTS, a local oscillator (LO) source to transmit the local oscillator into the FTS, and first and second pickups each configured to capture a corresponding combined signal of the first optical beam and the LO forming a beat frequency signal, wherein the beat frequency signal of the combined signals captured by the first and second pickups are formed at quadrature phase increments with respect to each other.

2. The receiver of claim 1, wherein the image rejection mixer comprises third and fourth pickups each configured to capture a corresponding combined signal of the first optical beam and the LO forming a beat frequency signal, wherein the beat frequency signal of the combined signals captured by the first, second, third and fourth pickups are formed at quadrature phase increments with respect to each other.

3. The receiver of claim 2, further comprising:

a first set of balanced photodiodes configured to receive the combined signals from the first and second pickups to generate a first intermediate frequency (IF) electrical signal;

a second set of balanced photodiodes configured to receive the combined signals from the third and fourth pickups to generate a second IF electrical signal; and a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

4. The receiver of claim 2, wherein the first, second, third and fourth pickups are located at a downstream side of the Fourier transform space (FTS) and are spaced apart from one another along an output surface of the Fourier transform space (FTS), and wherein the first optical beam source and the local oscillator (LO) source are located at an upstream side of the Fourier transform space (FTS) and are spaced apart from one another along an input surface of the Fourier transform space (FTS).

5. The receiver of claim 1, further comprising:

a first photodiode configured to receive the combined signal from the first pickup to generate a first intermediate frequency (IF) electrical signal;

a second photodiode configured to receive the combined signal from the second pickup to generate a second IF electrical signal; and a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

6. The receiver of claim 1, wherein the Fourier transform space (FTS) is defined between an input surface and an output surface, wherein the first optical beam and the LO are input into the Fourier transform space (FTS) respectively at first and second locations at the input surface, wherein the first and second pickups are respectively arranged at third and fourth locations at the output surface, wherein a first optical path length between the first and third locations is different than a second optical path length between the first and fourth locations.

7. The receiver of claim 6, wherein a third optical path length between the second location and the third location is different than a fourth optical path length between the second location and the fourth location.

8. The receiver of claim 1, wherein the Fourier transform space (FTS) is defined between an input surface and an output surface, wherein the first optical beam and the LO are input into the Fourier transform space (FTS) respectively at first and second locations at the input surface, wherein the first and second pickups are respectively arranged at third and fourth locations at the output surface, wherein a spacing $d_{in}$ between the first location and the second location is equal to a spacing $d_{out}$ between the third location and the fourth location.

9. The receiver of claim 1, wherein the image rejection mixer comprises a star coupler that forms the Fourier transform space (FTS), the star coupler comprising a first input port configured to receive the first optical beam, a second input port configured to receive the LO, and wherein the first and second pickups are each configured to capture the corresponding combined signals of the first optical beam and the LO from the Fourier transform space (FTS).

10. The receiver of claim 9, wherein each of the plurality of sensors include a corresponding image rejection mixer that each comprise a corresponding star coupler configured to receive a corresponding optical beam captured by the sensor.

11. The receiver of claim 9, further comprising:
a first set of balanced photodiodes configured to receive the combined signals from the first and second pickups to generate a first intermediate frequency (IF) electrical signal;
a second set of balanced photodiodes configured to receive the combined signals from third and fourth pickups of the star coupler to generate a second IF electrical signal; and
a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

12. The receiver of claim 9, further comprising:
a first photodiode configured to receive the combined signal from the first pickup to generate a first intermediate frequency (IF) electrical signal;
a second photodiode configured to receive the combined signal from the second pickup to generate a second IF electrical signal; and
a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

13. A receiver comprising:
a plurality of channels that are each coupled to an interference space, each channel comprising:
an electro-optic modulator to modulate an RF electrical signal with an optical carrier signal to generate a corresponding modulated optical signal including the optical carrier signal and two sidebands that constitute a first upconverted optical signal and a second upconverted optical signal, respectively,
a first optical waveguide configured to convey the first upconverted optical signal to the interference space;
the interference space configured to receive the upconverted optical signals at a channel edge of the interference space to allow the upconverted optical signals to interfere with each other and form one or more optical beams at a beamspace edge of the interference space;
a plurality of sensors, including a first sensor, arranged at the beamspace edge to capture an interference pattern at the beamspace edge including the one or more optical beams, the plurality of sensors each comprising a sensor having an image rejection mixer, each image rejection mixer comprising a star coupler forming a Fourier transform space (FTS), the star coupler comprising:
a first input port configured to receive a corresponding optical beam of the interference pattern;
a second input port configured to receive a local oscillator (LO) from a local oscillator (LO) source; and
first and second pickups each configured to capture a corresponding combined signal of the received optical beam and the LO forming a beat frequency signal, wherein the beat frequency signals of the combined signals captured by the first and second pickups are formed at quadrature phase increments with respect to each other.

14. The receiver of claim 13, wherein, with respect to the first sensor:
the Fourier transform space (FTS) is defined between an input surface and an output surface, the corresponding optical beam and the LO are input into the Fourier transform space (FTS) respectively at first and second locations at the input surface, the first and second pickups are respectively arranged at third and fourth locations at the output surface, a first optical path length between the first and third locations is different than a second optical path length between the first and fourth locations.

15. The receiver of claim 14, wherein, with respect to the first sensor, a third optical path length between the second location and the third location is different than a fourth optical path length between the second location and the fourth location.

16. The receiver of claim 13, wherein, with respect to the first sensor:
the Fourier transform space (FTS) is defined between an input surface and an output surface,
the corresponding optical beam and the LO are input into the Fourier transform space (FTS) respectively at first and second locations at the input surface,
the first and second pickups are respectively arranged at third and fourth locations at the output surface, and
a spacing $d_{in}$ between the first location and the second location is equal to a spacing $d_{out}$ between the third location and the fourth location.

17. The receiver of claim 13, wherein each of the sensors further comprise:
a first set of balanced photodiodes configured to receive the combined signals from the first and second pickups to generate a first intermediate frequency (IF) electrical signal;
a second set of balanced photodiodes configured to receive the combined signals from third and fourth pickups of the star coupler to generate a second IF electrical signal; and
a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

18. The receiver of claim 13, wherein, with respect to each sensor, the pickup array comprises third and fourth pickups each configured to capture a corresponding combined signal of the received optical beam and the LO forming a beat frequency signal, wherein the beat frequency signals of the combined signals captured by the first, second, third and fourth pickups are formed at quadrature phase increments with respect to each other.

19. The receiver of claim 18, wherein each sensor further comprises:

a first set of balanced photodiodes configured to receive the combined signals from the first and second pickups to generate a first intermediate frequency (IF) electrical signal;

a second set of balanced photodiodes configured to receive the combined signals from the third and fourth pickups to generate a second IF electrical signal; and a 90 degree hybrid coupler to receive the first IF electrical signal at a 0 degree input port and to receive the second IF electrical signal at a 90 degree input port, and to combine the first IF electrical signal with a phase shifted second IF electrical signal to generate an output IF electrical signal.

20. A method of performing an image rejection on received radio frequency (RF) beams, the method comprising:

capturing a first RF beam with an antenna array comprising a plurality of antennas, each of the antennas generating a corresponding RF electrical signal;

modulating each RF electrical signal with an optical carrier signal to generate a corresponding modulated optical signal including the optical carrier signal and two sidebands that constitute a first upconverted optical signal and a second upconverted optical signal, respectively;

forming a first optical beam corresponding to the first RF beam at an output edge of an interference space including receiving at an input edge of the interference space at least the first upconverted optical signals;

capturing the first optical beam at the output of the interference space;

delivering the first optical beam and a local oscillator (LO) to a Fourier transform space (FTS);

capturing by first and second pickups first and second composite optical signals, respectively, wherein the first and second composite optical signals each comprise a combination of the first optical beam and the LO that form a corresponding beat frequency signal, wherein the beat frequency signal of the first composite optical signal and the beat frequency signal of the second composite optical signal are formed at quadrature phase increments with respect to each other.

* * * * *